(12) United States Patent
Chang et al.

(10) Patent No.: US 12,183,695 B2
(45) Date of Patent: Dec. 31, 2024

(54) METHOD OF MANUFACTURING PACKAGE STRUCTURE

(71) Applicant: TAIWAN SEMICONDUCTOR MANUFACTURING COMPANY LTD., Hsinchu (TW)

(72) Inventors: Jen-Yuan Chang, Hsinchu (TW); Chia-Ping Lai, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 167 days.

(21) Appl. No.: 17/815,244

(22) Filed: Jul. 27, 2022

(65) Prior Publication Data

US 2022/0367392 A1 Nov. 17, 2022

Related U.S. Application Data

(62) Division of application No. 17/085,230, filed on Oct. 30, 2020, now Pat. No. 11,437,332.

(51) Int. Cl.
*H01L 23/00* (2006.01)

(52) U.S. Cl.
CPC .............. *H01L 24/05* (2013.01); *H01L 24/03* (2013.01); *H01L 24/27* (2013.01); *H01L 24/29* (2013.01); *H01L 2224/05011* (2013.01); *H01L 2224/05573* (2013.01); *H01L 2224/29028* (2013.01); *H01L 2224/2957* (2013.01)

(58) Field of Classification Search
CPC ........... H01L 24/05; H01L 2224/29028; H01L 2224/05011
See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,520,385 B1* | 12/2016 | Chen | H01L 23/49827 |
| 2018/0012868 A1* | 1/2018 | Huang | H01L 24/94 |

* cited by examiner

*Primary Examiner* — Dale E Page
*Assistant Examiner* — Wilner Jean Baptiste
(74) *Attorney, Agent, or Firm* — WPAT LAW; Anthony King

(57) ABSTRACT

A method of manufacturing a package structure is provided. The method of manufacturing a package structure comprises receiving a first semiconductor structure and a second semiconductor structure; forming an isolation layer on each semiconductor structure; forming at least one supporting structure and at least one pad trench in the isolation layer; filling the pad trench with electrically conductive material; planarizing the isolation layer and the electrically conductive material to form bonding pads in a bonding layer on each semiconductor structure; and bonding the semiconductor structures.

20 Claims, 24 Drawing Sheets

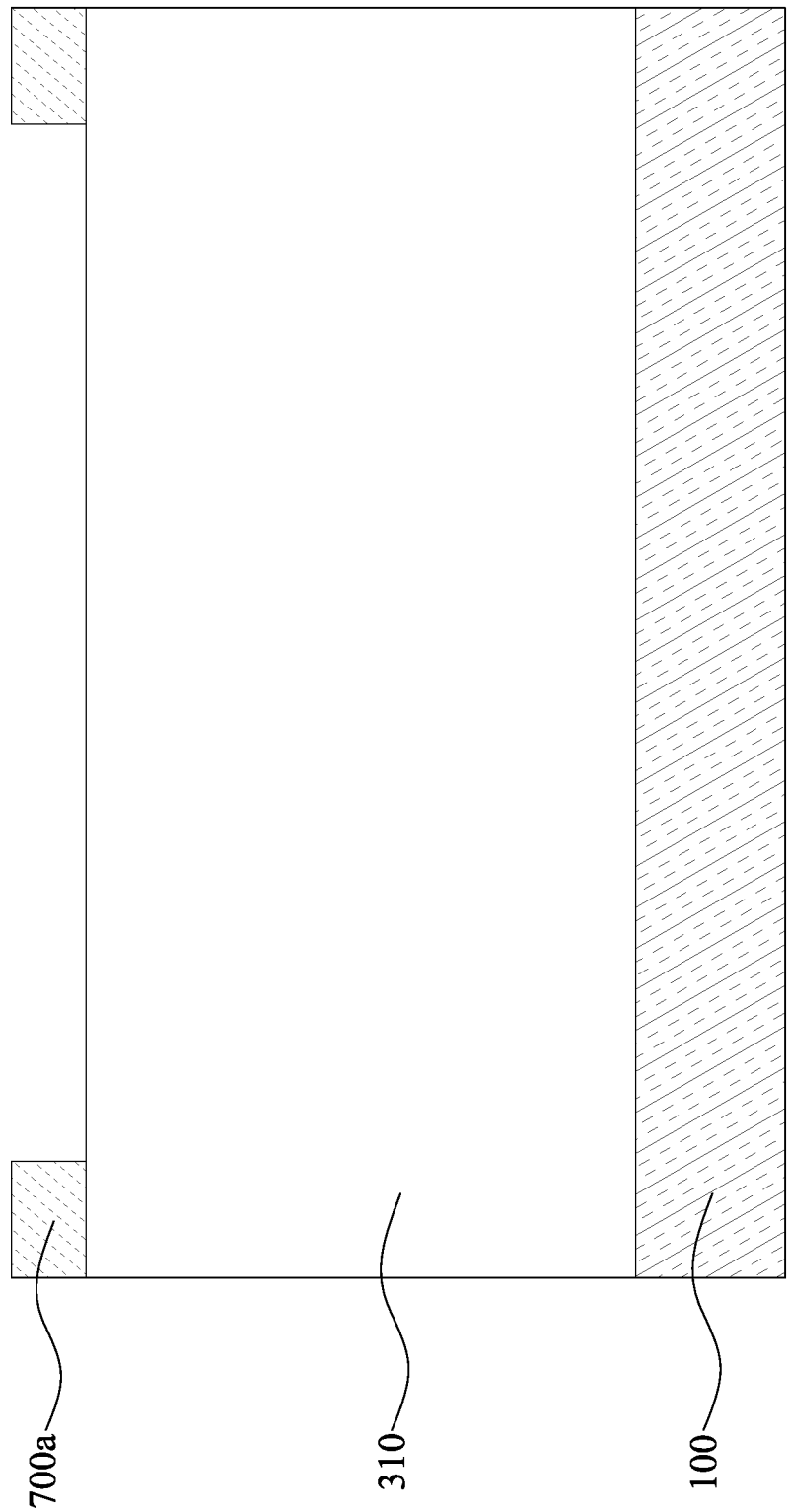

METHOD OF MANUFACTURING PACKAGE STRUCTURE

PRIORITY CLAIM AND CROSS-REFERENCE

This application a divisional application of U.S. patent application Ser. No. 17/085,230 filed on Oct. 30, 2020, entitled of "PACKAGE STRUCTURE AND METHOD OF MANUFACTURING THE SAME"; this application is incorporated herein by reference in their entireties.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the fusion bonding, an oxide surface of a wafer is bonded to an oxide surface or a silicon surface of another wafer. In the eutectic bonding, two eutectic materials are placed together, and are applied with a high pressure and a high temperature. The eutectic materials are hence molten. When the melted eutectic materials are solidified, the waters are bonded together. In the direct metal-to-metal bonding, two bonding pads are pressed against each other at an elevated temperature, and the inter-diffusion of the bonding pads causes the bonding of the bonding pads. In the hybrid bonding, the bonding pads of two wafers are bonded to each other through direct metal-to-metal bonding, and a non-metal surface of one of the two wafers is bonded to non-metal surface of the other wafer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 12A to 12F illustrate diagrammatic cross-sectional side views of some another embodiments of a package structure at various stages of fabrication, according to the method of FIG. 11.

DETAILED DESCRIPTION OF THE DISCLOSURE

Figure 1:
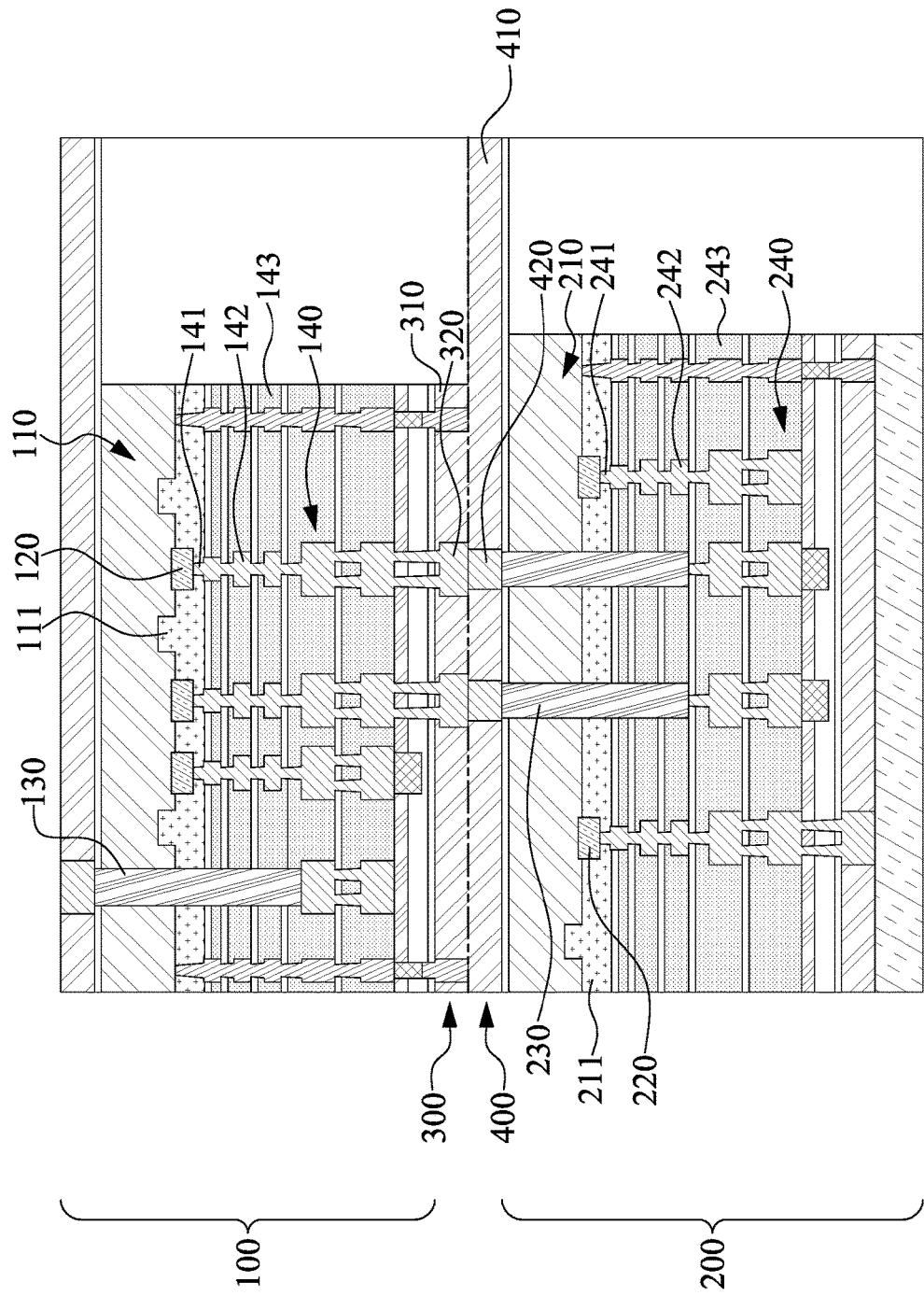
FIG. 1 is a fragmentary cross-sectional view of a package structure in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and; or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

When bonding two package components, metal pads in one package component bond to those in the other package component. To achieve desired electrical contact, each metal pad is designed to have a predetermined surface area. The surface area of the metal pad in one package component corresponds to that in the other package component, so the surface area of the interface of the metal pads of two package components would be identical to the predetermined surface area of each metal pad. To ensure the interface with the predetermined surface area, precise alignment of both package components is required. If both package components are not precisely aligned (also called "overlay shift"), the surface area of the interface is smaller than originally designed. Such insufficient contact area results in increased resistance. Sometimes, alignment tools, such as alignment marks, may be used to align both package components. Additionally or alternatively, additional alignment process may be performed. Nevertheless, there is still a need to find an efficient way to ensure that overlay shift does not occur.

On the other hand, in some cases, the surface of the metal pad may have a slight tendency to form concavities, so called dishing effect, which is induced during the planarization process. Due to the dishing effect, the metal pads may not completely contact with each other, which may cause further reliability issues. There is also a need to find a solution to alleviate the dishing effect.

Figure 2:
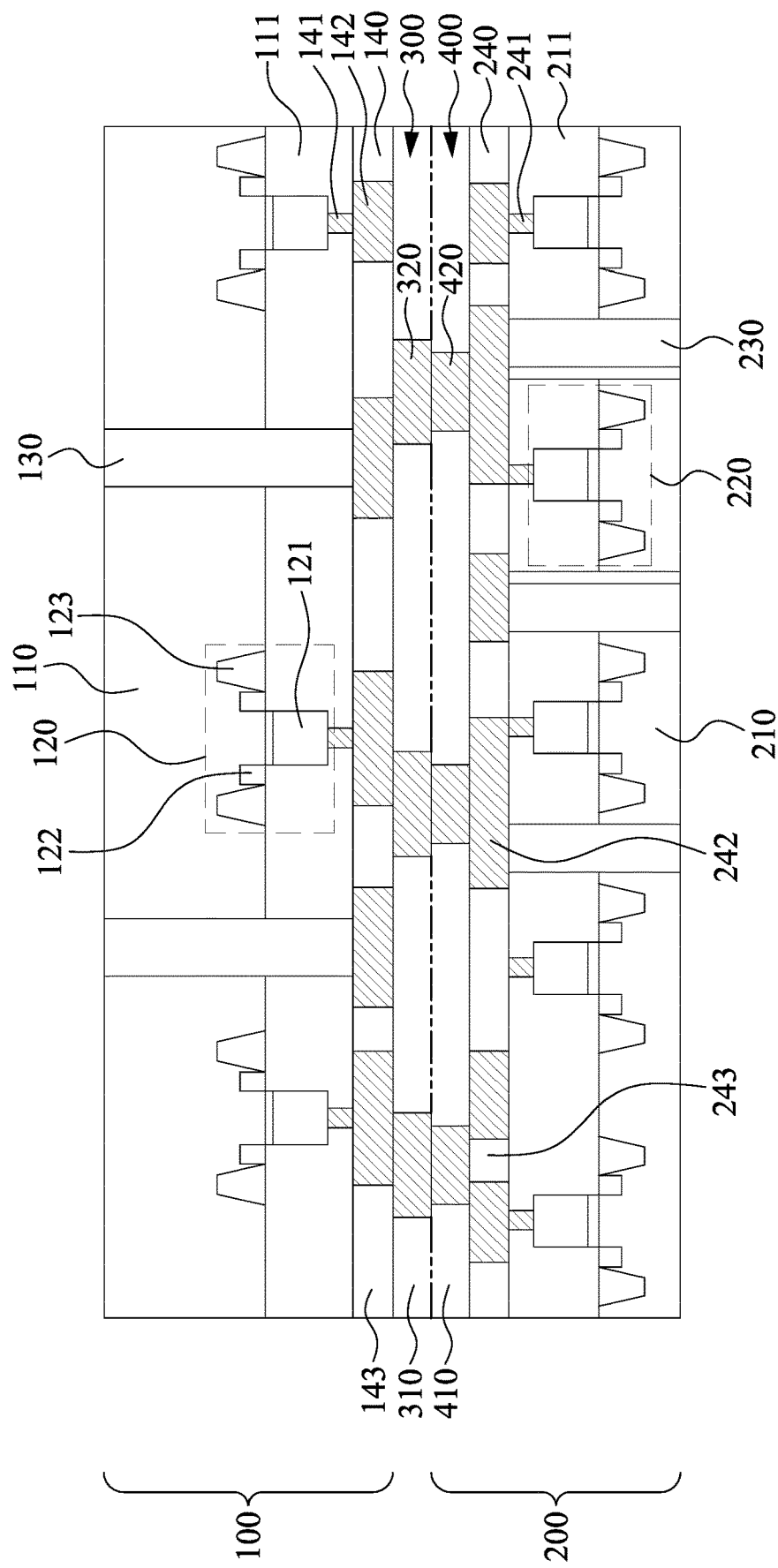
FIG. 2 is a fragmentary cross-sectional view of a package structure in accordance with some another embodiments of the present disclosure.

FIGS. 1 and 2 illustrate cross-sectional views of a package structure according to some embodiments of the present disclosure. The package structure comprises a first semiconductor structure 100, a second semiconductor structure 200, a first bonding layer 300 and a second bonding layer 400. The semiconductor structure 100, 200 respectively may be die, package, wafer or the like. Therefore, the package structure of the present invention may involve die-to-die bonding, die-to-wafer bonding, wafer-to-wafer bonding, chip-to-package bonding and the like.

The first semiconductor structure 100 may comprise a first substrate 110, first device regions 120, first through-substrate vias (TSVs) 130 and a first metallization structure 140. The first substrate 110 may be a silicon substrate, a silicon germanium substrate, a silicon carbon substrate, an III-V compound semiconductor substrate, or the like. That is, the substrate 110 may be made of silicon or other semiconductor materials. Alternatively or additionally, the substrate 110 may include other elementary semiconductor materials such as germanium. In some embodiments, the substrate 110 is made of a compound, such as silicon carbide, gallium arsenic, indium arsenide, or indium phosphide. In some embodiments, semiconductor substrate 110 is made of an alloy, such as silicon germanium, silicon germanium carbide, gallium arsenic phosphide, or gallium indium phosphide. In some embodiments, semiconductor substrate 110 includes an epitaxial layer. For example, the substrate 110 has an epitaxial layer overlying a bulk semiconductor.

In some embodiments, the first device regions 120 are formed in the first wafer 110 in a front-end-of-line (FEOL) process. Each device region 120 includes a gate structure 121 embedded in a dielectric layer 111, source/drain regions 122, and isolation structures 123, such as shallow trench isolation (STI) structures. Gate structure 121 includes a gate dielectric layer and a gate electrode. Other structures may be formed in device regions 120. Device regions 120 may form various N-type metal-oxide semiconductor (NMOS) and/or P-type metal-oxide semiconductor (PMOS) devices, such as transistors or memories, and the like, which are interconnected to perform one or more functions. Other devices, such as capacitors, resistors, diodes, photo-diodes, fuses, and the like may also be formed on substrate 110.

The first through-substrate vias (TSVs) 130 can be formed between two adjacent device regions 120. The first TSVs 130 extend into the first substrate 110. The first TSVs 130 are used to provide electrical connections. The number of the first TSVs 130 may be adjusted according to actual application.

The first metallization structure 140 can be formed over the first TSVs 130 and/or the first device regions 120 in a middle-end-of-line (MEM) process and a back-end-of-line (BEOL) process to individually connect to the first TSVs 130 and/or the device regions 120. In some embodiments, the first metallization structure 140 includes contact plugs 141 and interconnect structures, such as conductive features and vias 142. The contact plugs 141 are formed in the dielectric layer 111. The conductive features and vias 142 are embedded in an insulating material 143. In some embodiments, insulating material 143 is made of silicon oxide. In some embodiments, the insulating material 143 includes multiple dielectric layers of dielectric materials. The first metallization structure 140 shown in FIGS. 1 and 2 is merely for illustrative purposes and may include other configurations, such as one or more conductive lines and via layers; but the disclosures are not limited thereto.

The second semiconductor structure 200 is similar to the first semiconductor structure 100. The second semiconductor structure 200 includes a second substrate 210, second device regions 220, second through-substrate vias (TSVs) 230 and a second metallization structure 240. The second substrate 210 is similar to the first substrate 110. The second device regions 220 are similar to the first device regions 120 and include a gate structure embedded in a dielectric layer 211, source/drain regions, and isolation layers. The second TSVs 230 and second metallization structure 240 are similar to the first TSVs 130 and first metallization structure 140. The second metallization structure 240 includes a contact plug 241 embedded in the dielectric layer 211 and conductive features 242 embedded in an insulating material 243.

The first bonding layer 300 and the second bonding layer 400 are interposed between the first semiconductor structure 100 and the second semiconductor structure 200 for bonding the first semiconductor structure 100 to the second semiconductor structure 200. FIG. 1 illustrates a package structure in accordance with some embodiments, wherein semiconductor structures 100 and 200 are configured in a face-to-back (F2B) bonding configuration. The front surface of the first semiconductor structure 100 is facing the back surface of the second semiconductor structure 200. The first bonding layer 300 is formed on the front surface of the first semiconductor structure 100 and the second bonding layer 400 is formed on the back surface of the second semiconductor structure 200. The term "front" surface is a term used herein indicating the major surface of the device upon which active devices and interconnect layers are formed. Likewise, the "back" surface of a semiconductor structure is the surface opposite to the front. It should be noted that different configurations may also be adopted in the present invention. For example, FIG. 2 illustrates a package structure in accordance with some another embodiments, wherein semiconductor structures 100 and 200 are configured in the face-to-face (F2F) bonding configuration. The front surface of the first semiconductor structure 100 is facing the front surface of the second semiconductor structure 200. The first bonding layer 300 is formed on the front surface of the first semiconductor structure 100 and the second bonding layer 400 is also formed on the front surface of the second semiconductor structure 200.

The first bonding layer 300 comprises an isolation layer 310 and a plurality of first bonding pads 320. The isolation layer 310 may comprise non-electrically conductive materials, such as dielectric materials, polymers or the like. In some embodiments, the polymer may be benzocyclobutene (BCB) polymer, polyimide (PI), or polybenzoxazole (PBC)). In some embodiments, isolation layer 310 is made of benzocyclobutene (BCB) polymer and is applied to the first semiconductor structure 100 by, for example, spin coating. Since benzocyclobutene polymer is a soil material, it can tolerant more stress resulting from the TSV formed in the subsequent processes, compared to other dielectric materials such as silicon dioxide.

The first bonding pads 320 are embedded in the isolation layer 310. The bonding pads 320 may include active bonding pads and dummy bonding pads. Active bonding pads may be electrically connected to the device regions 120 through the first metallization structure 140. Dummy bonding pads do not have electrical functions. Accordingly, dummy bonding pads may be electrically floating. In some embodiments, active bonding pads and dummy bonding pads have the same top-view shape, the same top-view size, and comprise the same material. In some alternative embodiments, active bonding pads and dummy bonding pads have different top-view shapes and/or different top-view sizes. Whether a bonding pad 320 is used as an active bonding pad or a dummy bonding pad is determined by its electrical connection. The bonding pads 320 that are not selected to provide electrical connection thus become dummy bonding pads. As shown in FIG. 2, the bonding pads 320 connect to the conductive features 142. In some embodiments, bonding pads 320 may directly connect to the conductive features 142. In some alternative embodiments, bonding pads 320 may connect to the conductive features 142 through a via.

The second bonding layer 400 is similar to the first bonding layer 300 and comprises an isolation layer 410 and a plurality of second bonding pads 420. The isolation layer 410 may be identical or similar to those for the isolation layer 310 as described above; therefore, repeated descriptions of such details are omitted for brevity. Bonding pads 420 are embedded in the isolation layer 410 and may be coupled to the second device regions 220 through the second metallization structure 240. The second bonding pads 420 may include active bonding pads and dummy bonding pads. Active bonding pads may be electrically connected to the second device regions 220. Dummy bonding pads do not have electrical functions.

In some embodiments, the first and second semiconductor structures 100 and 200 are bonded together through the first and second bonding layers 300 and 400 by hybrid bonding with application of heat and/or pressure. As shown in FIGS. 1 and 2, metallic bonding interfaces are present between both bonding pads 320 and 420 but a clear non-metallic interface may be absent between isolation layers 310 and 410 due to the reflowing process.

Figure 3A:
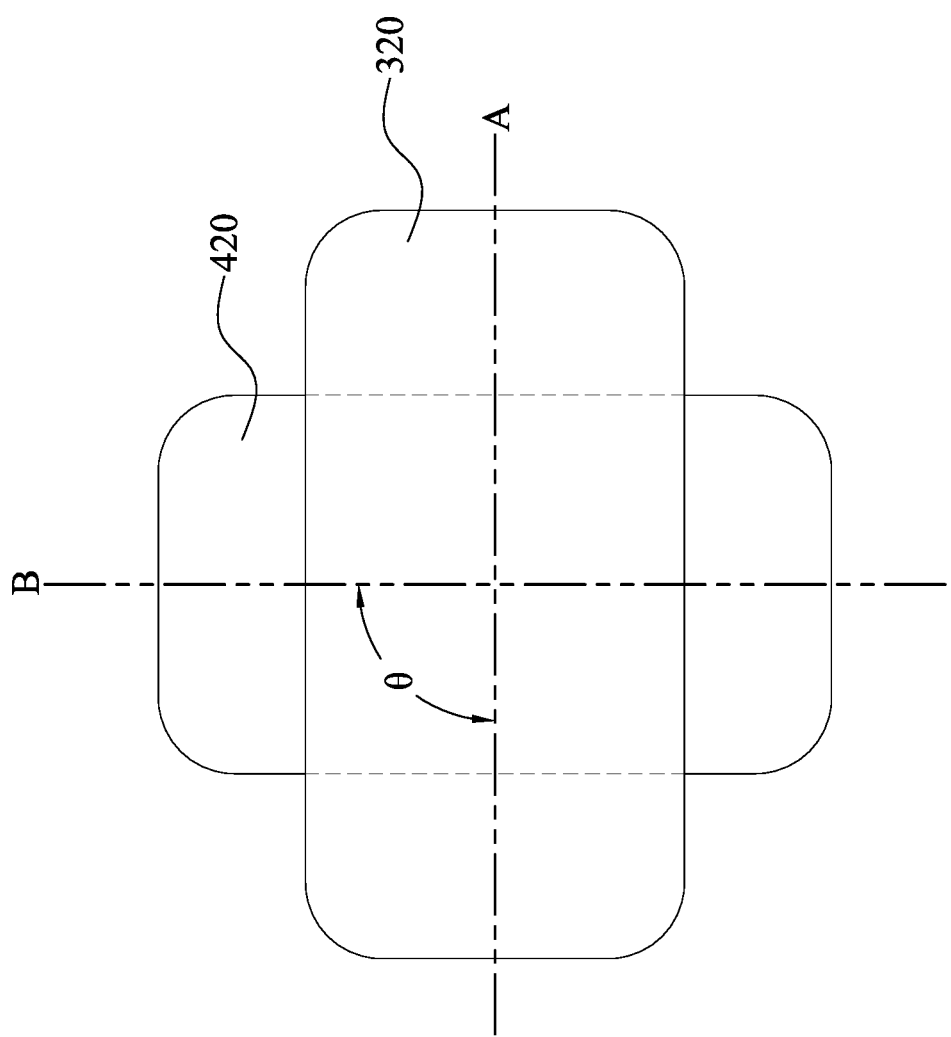
FIG. 3A is a top view of the first and second bonding pads of a package structure in accordance with some embodiments of the present disclosure.
Figure 3B:
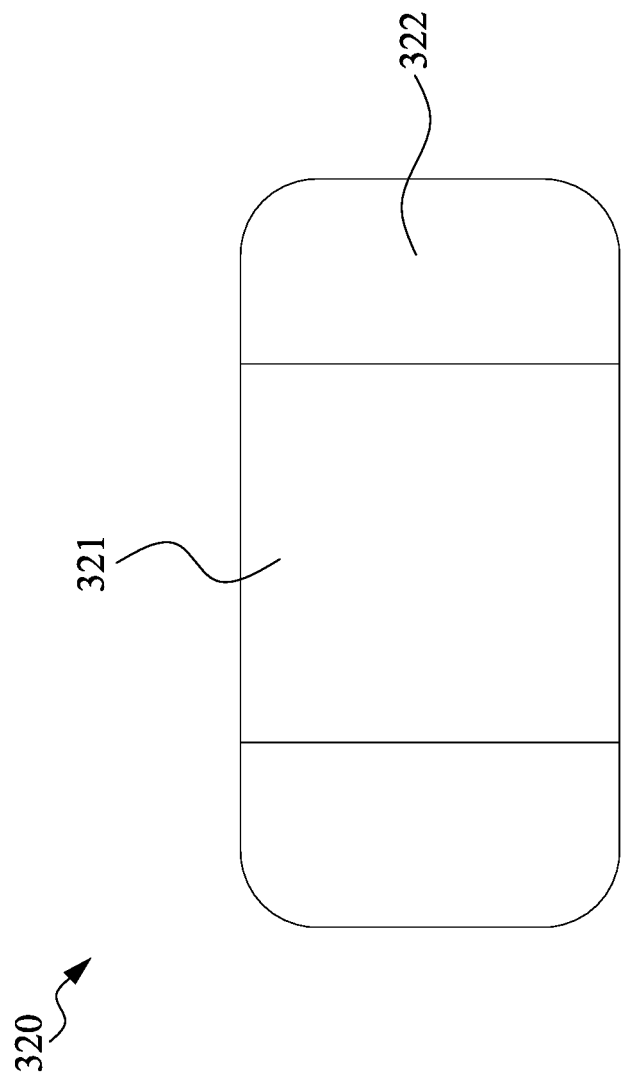
FIG. 3B is a top view of the first bonding pad of the package structure of FIG. 3A.
Figure 3C:
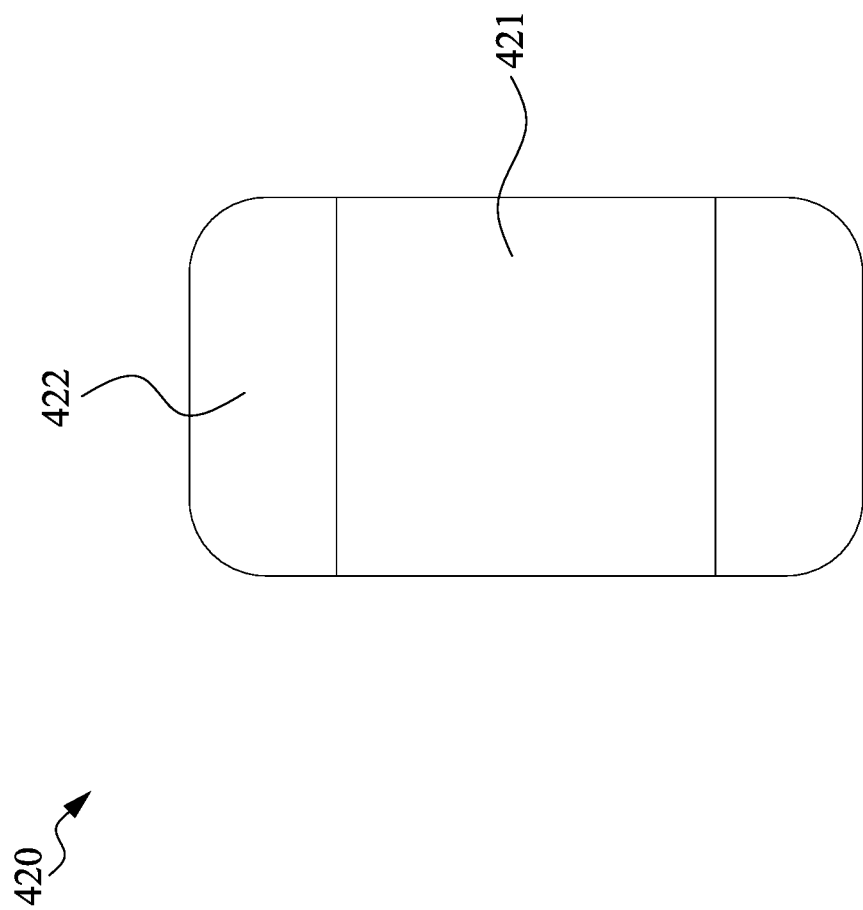
FIG. 3C is a top view of the second bonding pad of the package structure of FIG. 3A.

Each of the bonding pads 320 and 420 has a bonding surface. It is generally required that both bonding surfaces be completely overlapped when two bonding pads are bonded together; nevertheless, if overlay shift occurs between two bonding pads 320 and 420, the overlapped area of both bonding surfaces would be decreased, which results in increased electrical resistance. As shown in FIGS. 3A to 3C, in some embodiments of the present invention, to eliminate such overlay errors and the resulting resistance increasing issue, each bonding pad 320 and 420 has a bonding surface including a bonding region 321 and 421 and at least one buffer region 322 and 422. When the first bonding pad 320 is bonded to the second bonding pad 420, the bonding region 321 of the first bonding pad 320 is bonded to the bonding region 421 of the second bonding pad 420 while the first buffer region 322 of first bonding pad 320 is bonded to the isolation layer 410 of the second bonding pad 420 and the second buffer region 422 of second bonding pad 420 is bonded to the isolation layer 310 of the first bonding pad 320. In some embodiments, for one bonding surface, the ratio of the surface area of the buffer region 322 and 422 to that of the bonding region 321 and 421 may be from about 0.01 to about 10, in some embodiments, the ratio of the surface area of the buffer region 322 and 422 to that of the bonding region 321 and 421 may be from about 0.1 to about 5. In some embodiments, the ratio of the surface area of the buffer region 322 and 422 to that of the bonding region 321 and 421 may be from about 0.5 to about 4.

As shown in FIGS. 3B and 3C, the bonding surface of each bonding pad 320 and 420 includes one bonding region 321 and 421 and two buffer regions 322 and 422, so that the bonding region 321 and 421 is located between two buffer regions 322 and 422. In one bonding surface, the two huller regions 322 and 422 may have the same surface area or different surface areas. Even if overlay shift occurs between the first bonding pad 320 and the second bonding pad 420, the surface area of the bonding region 321 and 421 in both bonding pad 320 and 420 can be remained consistent or as expected because the existence of the buffer regions 322 and 422, so the electrical resistance would not increase.

Figure 4:
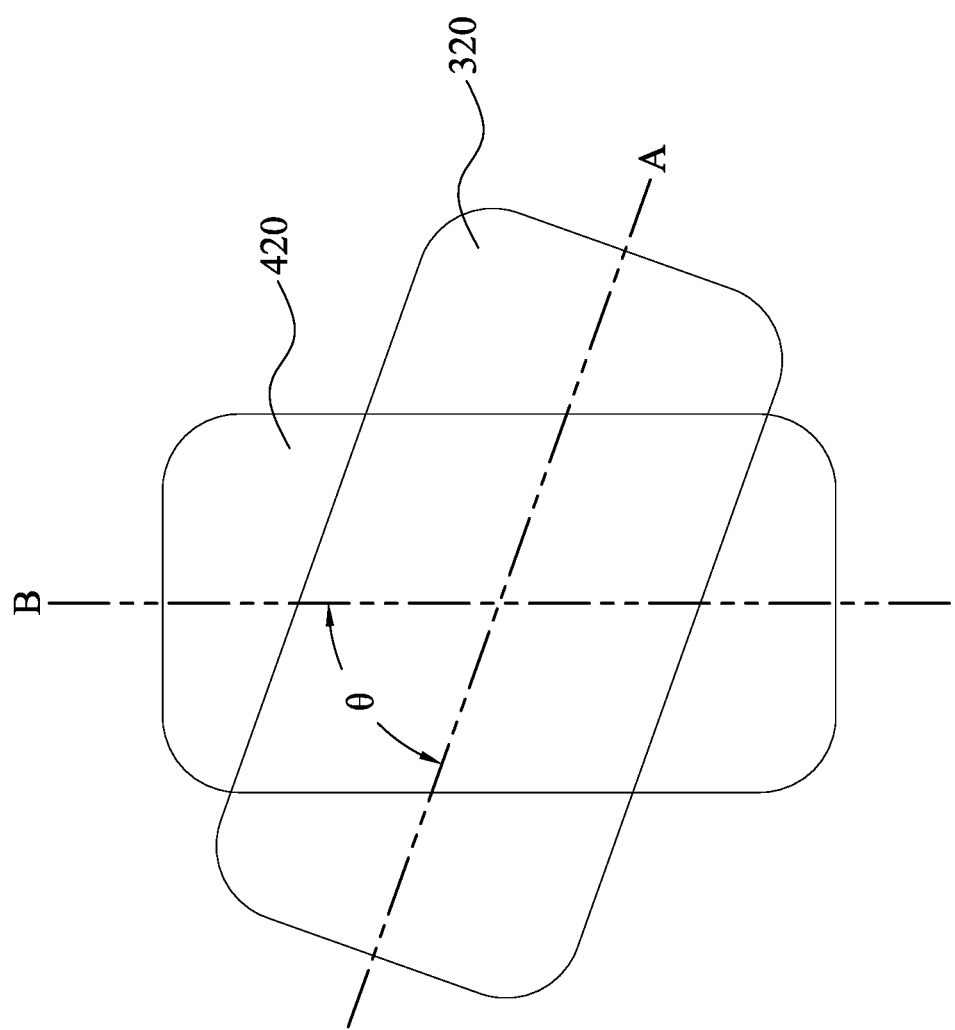
FIG. 4 is a top view of the first and second bonding pads of a package structure in accordance with some another embodiments of the present disclosure.

In some embodiments, the bonding surface of each bonding pad 320 and 420 may have various shapes, including rectangular shape, oval shape or other longilineal shapes. The bonding surface has a central axis. As shown in FIGS. 3A and 4, the bonding surface of the first bonding pad 320 has a central axis A and the bonding surface of the second bonding pad 420 has a central axis B. In some embodiments, the angle θ between the central axis A and the central axis B is larger than 0° and less than 180°. In some embodiments, the angle θ may range from about 10° to about 170°. In some embodiments, the angle θ may range from about 45° to about 135°. In some embodiments, the angle θ may be about 90° as shown in FIG. 3A. As mentioned above, the buffer regions 322 and 422 help to ensure the bonding surfaces of the first bonding pad 320 and the second bonding pad 420 as expected even if overlay shift occurs between the first bonding pad 320 and the second bonding pad 420. Further, in some embodiments, the buffer regions 322 and 422 help to ensure the bonding surfaces of the first bonding pad 320 and the second bonding pad 420 as expected even if a rotation-induced shift occurs.

In some embodiments of the present invention, hybrid bonding of both bonding layers 300 and 400 involves at least three types of bonding, including metal-to-metal bonding, non-metal-to-non-metal bonding and metal-to-non-metal bonding. The bonding region 321 of the first bonding pad 320 is bonded to the bonding region 421 of the second bonding pad 420 (i.e., metal-to-metal bonding). The isolation layer 310 of the first bonding layer 300 can be bonded to the isolation layer 410 of the second bonding layer 400 (i.e., non-metal-to-non-metal bonding). The buffer regions 322 and 422 can be bonded to the isolation layer 310 and 410 (i.e., metal-to-non-metal bonding).

Figure 5:
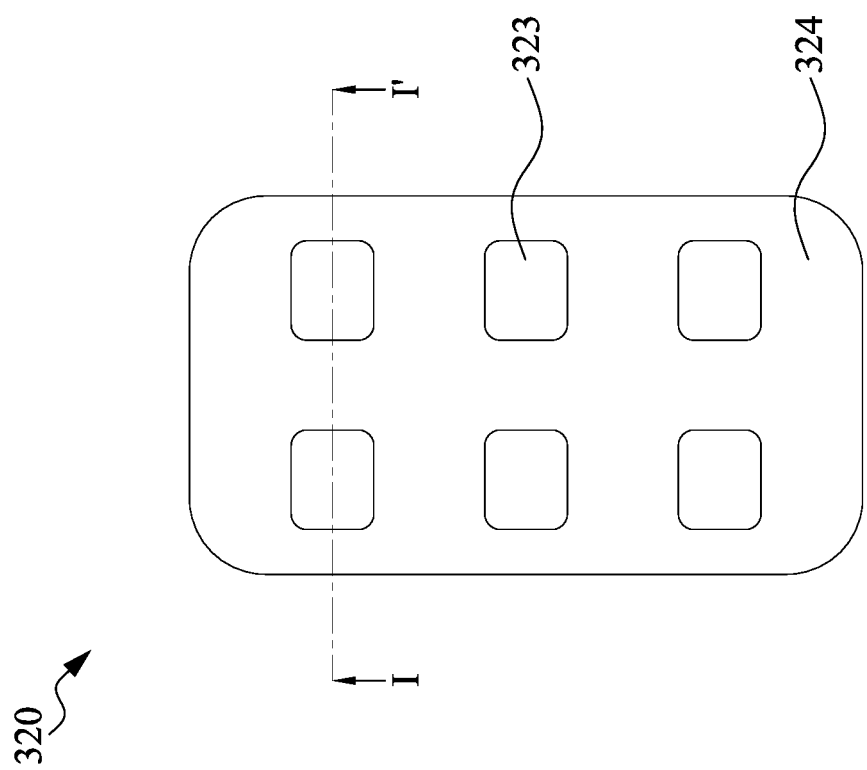
FIG. 5 is a top view of a bonding pad of a package structure in accordance with some embodiments of the present disclosure.
Figure 6:
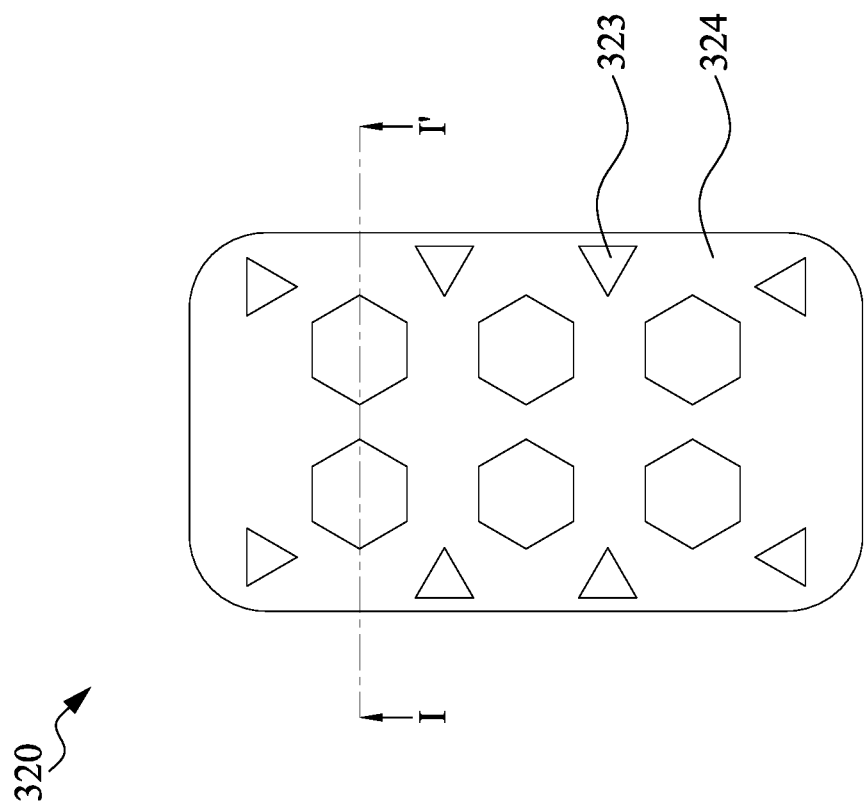
FIG. 6 is a top view of a bonding pad of a package structure in accordance with some another embodiments of the present disclosure.
Figure 7:
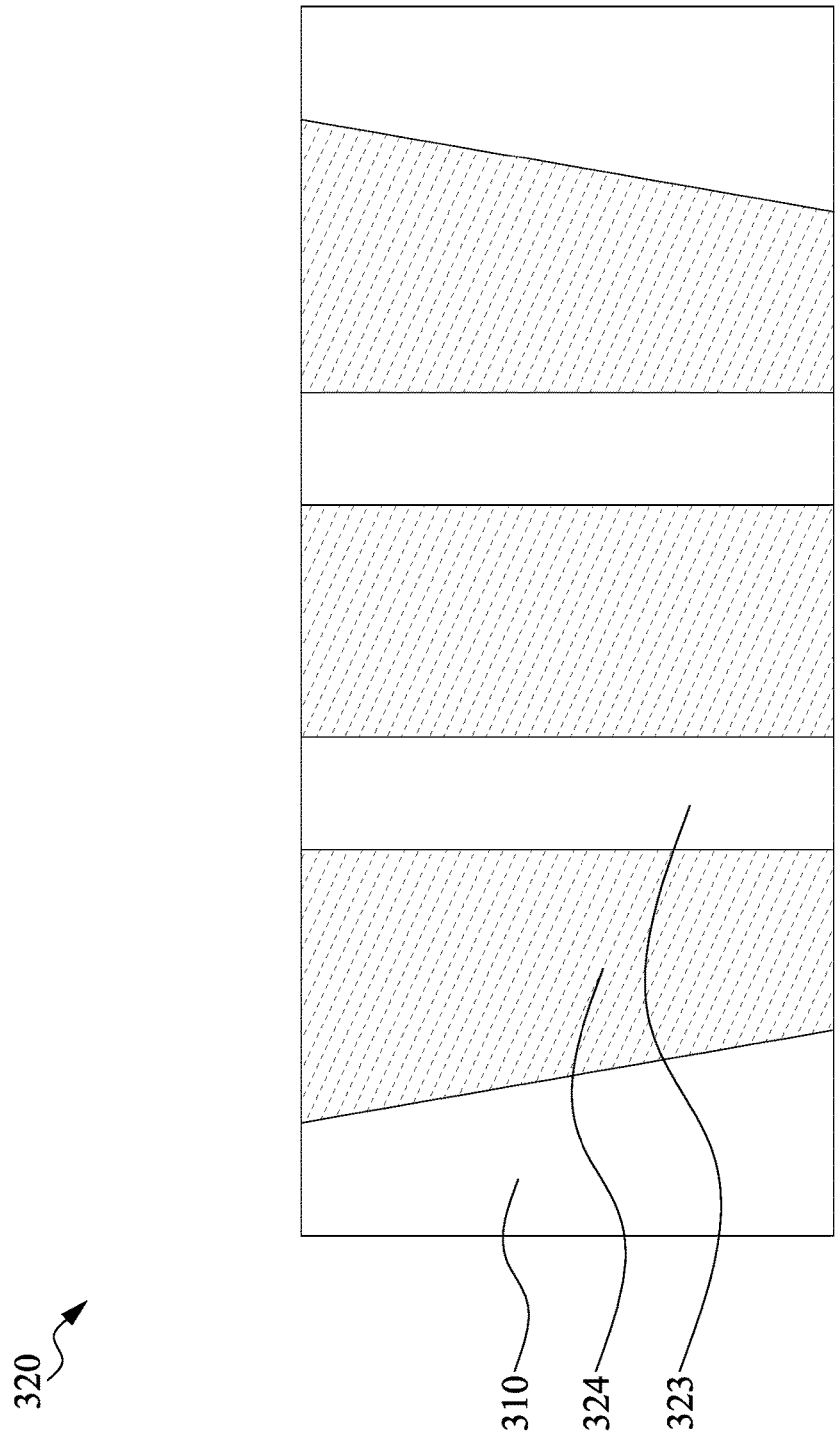
FIG. 7 is a cross-sectional view of a bonding pad of a package structure along line I-I' in FIG. 5 or FIG. 6 in accordance with some embodiments of the present disclosure.

In some embodiments, each bonding pad 320 and 420 may be a heterogeneous pad. In some embodiments, the active bonding pads may be made of conductive materials and the dummy bonding pads may be heterogeneous pads. In some embodiments, both of the active bonding pads and dummy bonding pads may be heterogeneous pads. The conductive materials may be copper (Cu), copper alloy, aluminum (Al), aluminum alloy, or combinations thereof. Other metal materials or metal alloys may be used. Each heterogeneous pad, such as the first bonding pad 320 shown in FIGS. 5 to 7, has a plurality of supporting structures 323 separated by an electrically conductive structure 324. The supporting structure 323 can be formed in the bonding pad 320 extending from the bonding surface to the opposite side as shown in FIG. 7 so as to contact the first semiconductor structure 100. In some embodiments, from the top view as shown in FIG. 5, the supporting structures 323 may be arranged uniformly in the bonding pad 320. In some another embodiments, as shown in FIG. 6, the number of the supporting structures 323 in the central portion of the bonding pad 320 is more than that in the peripheral portion since more sever dishing effect usually occurs in the central portion. Therefore, the number of the supporting structures 323 in one bonding pad may be gradually, such as stepwisely, decreased from the central portion to the peripheral portion.

In some embodiments, supporting structure 323 may be a cylinder or a polygonal prism, including but not limited to, triangular prism, rectangular prism, pentagonal prism, hexagonal prism and so on. In some embodiments, supporting structures 323 in one bonding pads may have the same shape. In some alternative embodiments, supporting structures 323 in one bonding pad may have different shapes as shown in FIG. 6. For example, supporting structures 323 in the peripheral portion may be triangular prisms and supporting structures 323 in the central portion may be hexagonal prisms to allow the surface area of the supporting structures 323 in the central portion larger than that in the peripheral portion to minimize the dishing effect.

In some embodiments, the supporting structures 323 may be made of materials with lower polishing rate selectivity than the electrically conductive structure 324 so as to minimize the introduction of significant dishing effect. For example, the supporting structures 323 may comprise electrically conductive materials, dielectric materials and other materials, but the disclosures are not limited thereto. In some embodiments, materials for the supporting structures 323 may be different from that for the electrically conductive structure 324. In some embodiments, materials for the supporting structures 323 may higher hardness, erosion resistance or the like than those for electrically conductive structure 324. The conductive materials may include, but not limited to, titanium nitride (TiN), tantalum nitride (TaN), tungsten (W) and so on. The dielectric materials may include, but not limited to, silicon oxide (such as SiO, $SiO_2$), silicon nitride (such as SiN, $Si_3N_4$), silicon carbide (SiC) and so on. In some embodiments, each bonding pad 320 has from about 0.1% in volume to about 99% in volume of the supporting structures 323 based on the total volume of the bonding pad 320. In some embodiments, each bonding pad 320 has from about 0.1% in volume to about 85% in volume of the supporting structures 323 based on the total volume of the bonding pad 320. In some embodiments, each bonding pad 320 has from about 0.1% in volume to about 75% in volume of the supporting structures 323 based on the total volume of the bonding pad 320.

In the embodiments where the supporting structures 323 are made of electrically conductive materials, each bonding pad 320 has about 0.1% in volume to about 99% in volume of the supporting structures 323 based on the total volume of the bonding pad 320. In some embodiments where the supporting structures 323 are made of electrically conductive materials, each bonding pad 320 has about 0.1% in volume to about 90% in volume of the supporting structures 323 based on the total volume of the bonding pad 320. In the embodiments where the supporting structures 323 are made of dielectric materials, each bonding pad 320 has from about 0.1% in volume to about 80% in volume of the supporting structures 323 based on the total volume of the bonding pad 320. In some embodiments where the supporting structures 323 are made of dielectric materials, each bonding pad 320 has from about 0.1% in volume to about 70% in volume of the supporting structures 323 based on the total volume of the bonding pad 320.

The electrically conductive structure 324 may comprise metal, metal alloy, and so on, such as copper (Cu), copper alloy, aluminum (Al), aluminum alloy, or combinations thereof.

Figure 8:
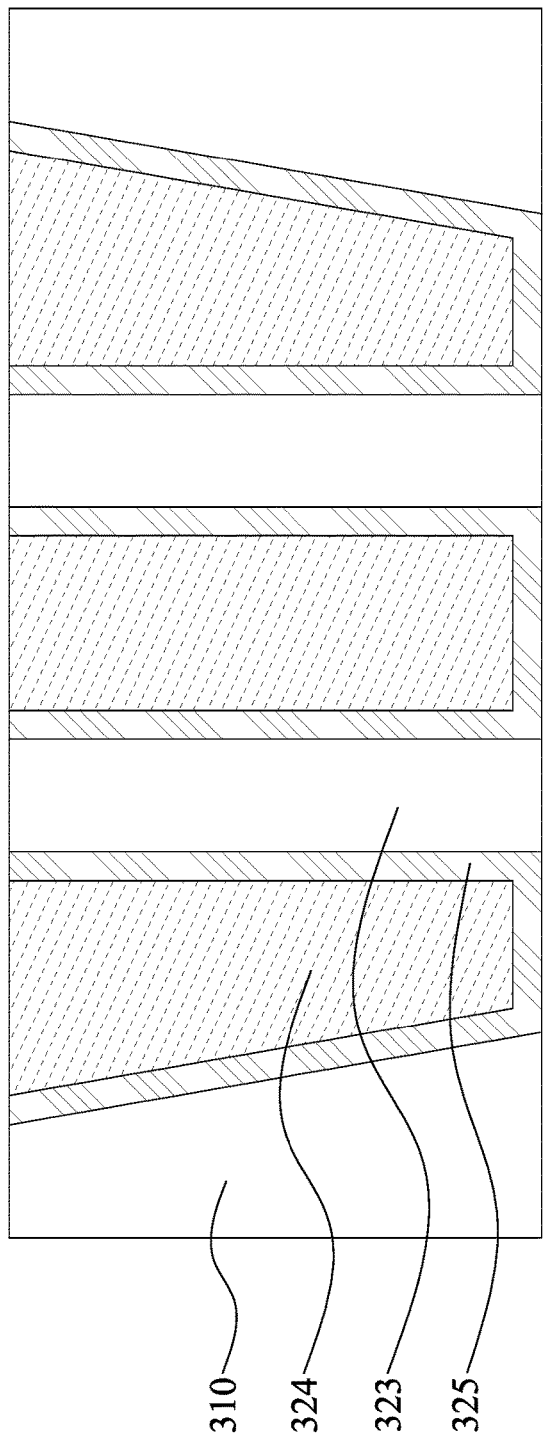
FIG. 8 is a cross-sectional view of a bonding pad of a package structure along line I-I' in FIG. 5 or FIG. 6 in accordance with some another embodiments of the present disclosure.

In some embodiments, as shown in FIG. 8, the electrically conductive structure 324 may be surrounded by an electrically conductive interlayer 325, so the electrically conductive interlayer 325 serve as a bottom and sidewall of the electrically conductive structure 324. Three different materials may be exposed from the bonding surface, including materials for the supporting structures 323, materials for the electrically conductive structure 324 and materials for the electrically conductive interlayer 325, which may decrease the dishing effect. The electrically conductive interlayer 325 may comprise conductive materials including, but not limited to, titanium nitride (TiN), tantalum nitride (TaN), tungsten (W) and so on. It is noted that although the reference numerals used in FIGS. 5 to 8 are those in the first bonding layer 300, the second bonding layer 400 may have the same arrangement; therefore, repeated descriptions for the second bonding layer 400 are omitted for brevity.

Figure 9:
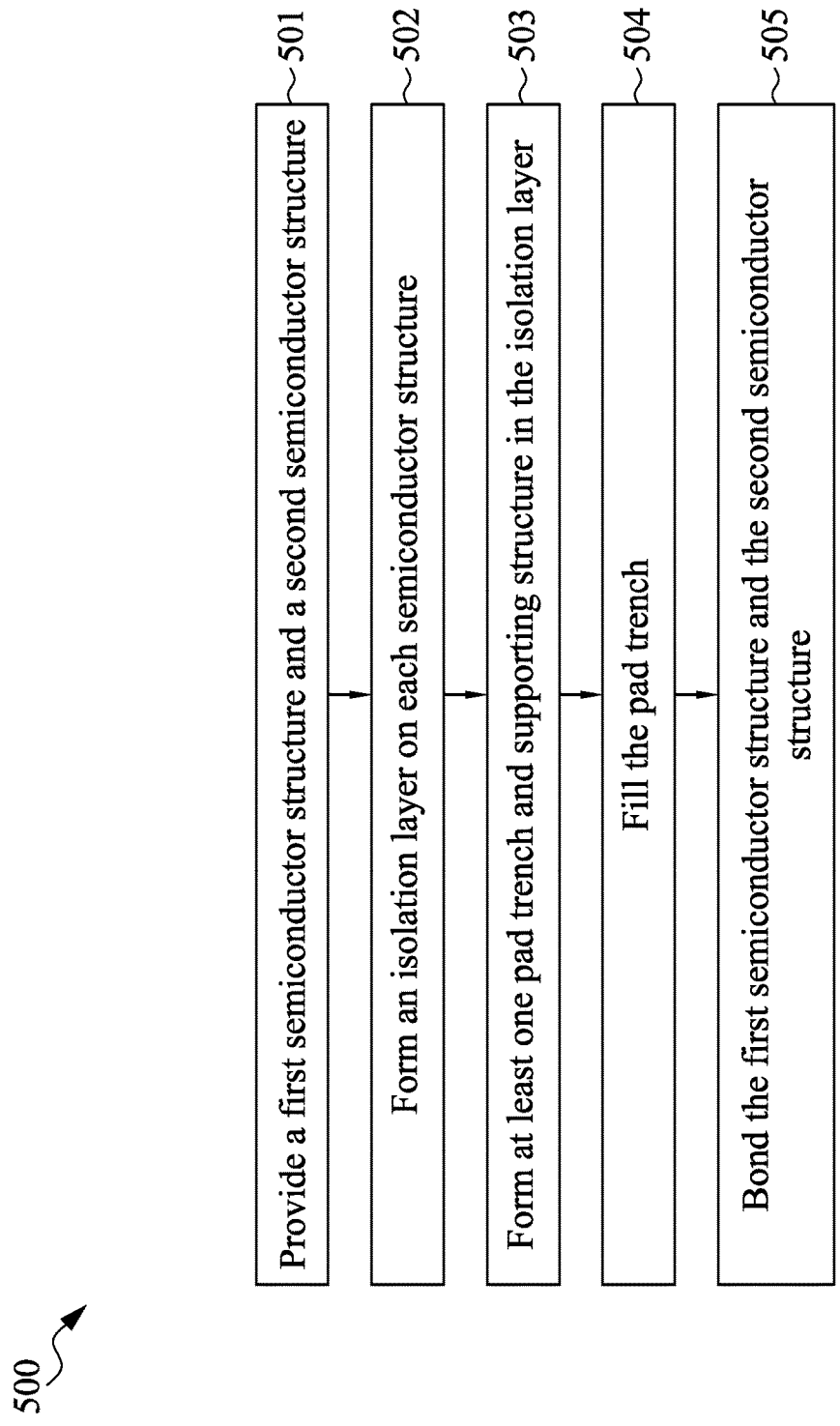
FIG. 9 is a flow chart illustrating a method of fabricating a package structure, in accordance with some embodiments of the present disclosure.

FIG. 9 is a flowchart representing a method 500 of manufacturing a package structure according to various aspects of the present disclosure in accordance with some embodiments. In some embodiments, the method 500 of manufacturing the package structure includes a number of operations (501, 502, 503, 504 and 505). The method 500 of manufacturing the package structure will be further described according to one or more embodiments. It should be noted that the operations of the method 500 may be rearranged or otherwise modified within the scope of the various aspects. It should further be noted that additional processes may be provided before, during, and after the method 500, and that some other processes may be only briefly described herein.

As shown in FIGS. 9 and 10A to 10C, method 500 begins at operation 501 by providing or receiving a first semiconductor structure 100 and a second semiconductor structure 200. The first semiconductor structure 100 may comprise a first substrate 110, first device regions 120, first through-substrate vias (TSVs) 130 and a first metallization structure 140; and second semiconductor structure 200 may comprise a second substrate 210, second device regions 220, second through-substrate vias (TSVs) 230 and a second metallization structure 240. The details of first and second semiconductor structures 100 and 200 are mentioned above and, therefore, the repeated descriptions of such details are omitted for brevity.

To form bonding layers 300 and 400 respectively on the first semiconductor structure 100 and the second semiconductor structure 200, the formation of bonding layers 300 and 400 comprises forming isolation layers 310 and 410 over the semiconductor structures 100 and 200 at operation 502; forming at least one pad trench and supporting structures in the isolation layers 310 and 410 at operation 503; and filling the pad trench at operation 504.

Figure 10A:
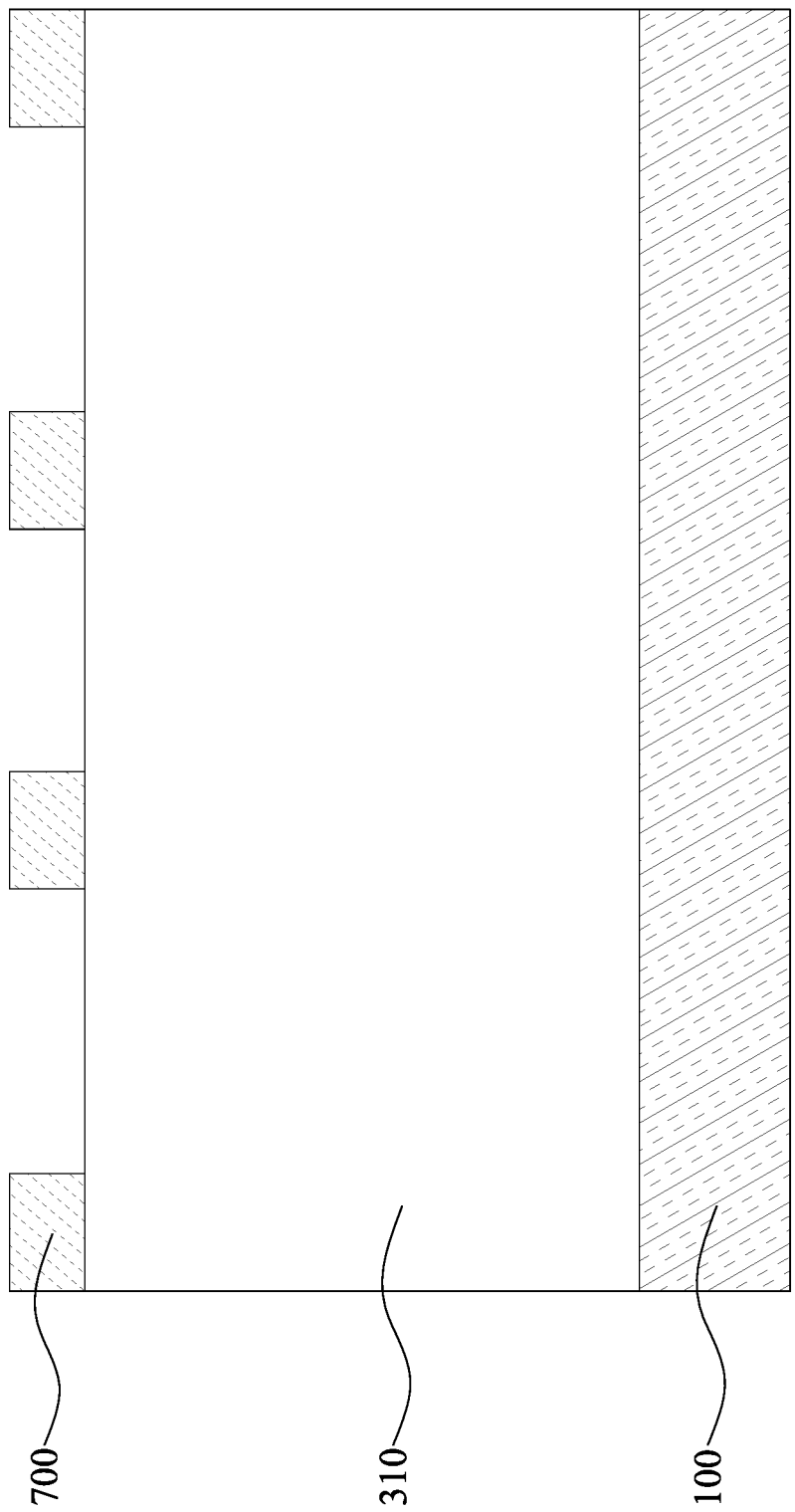
FIGS. 10A to 10C illustrate diagrammatic cross-sectional side views of some embodiments of a package structure at various stages of fabrication, according to the method of FIG. 9.

At operation 502, as shown in FIG. 10A, an isolation layer 310 is formed over the first semiconductor structure 100 using, for example, spin coating. The isolation layer 310 may comprise non-electrically conductive materials, such as dielectric materials, polymers or the like. In some embodiments, the polymer may be benzocyclobutene (BCB) polymer, polyimide (PI), or polybenzoxazole (PBO). In some embodiments, mask 700 can be formed over the isolation layer 310 for defining the location and dimension of the bonding pads 320. Mask 700 may include silicon oxide (such as $SiO_2$), silicon nitride (such as $Si_3N_4$), silicon oxynitride, silicon carbide, metal oxide (such as $HfO_2$, $ZrO_2$) and; or other suitable materials. Mask 700 may be formed using methods such as CVD or PVD.

Figure 10B:
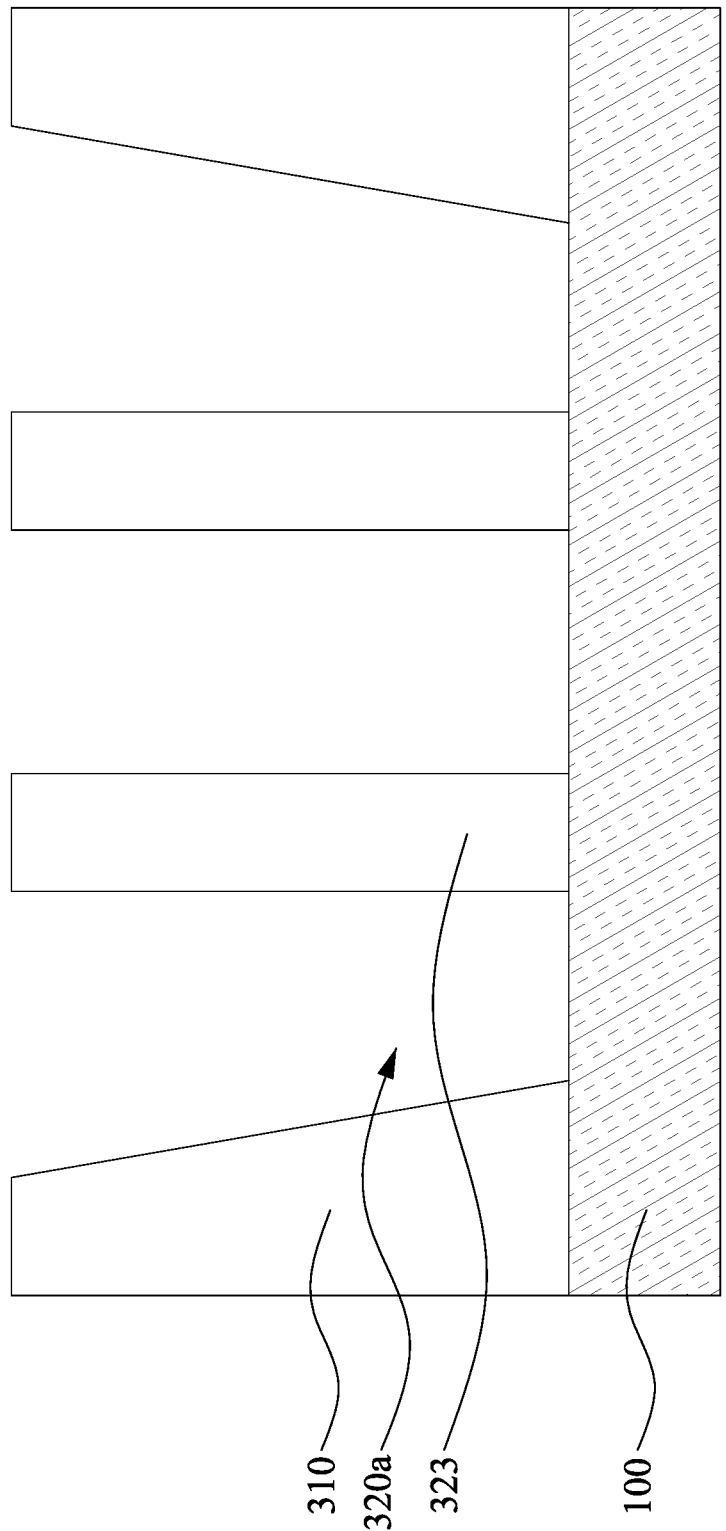

At operation 503, with reference to FIG. 10B, at least one trench 320a and supporting structure 323 may be formed in the isolation layer 310. Through a photolithography using mask 700, the isolation layer 310 is patterned. The isolation layer 310 is etched to form at least one pad trench 320a so that semiconductor structure 100 is exposed from the pad trench 320a, In each pad trench 320a, some portions of the isolation layer 310 may be left in the pad trench 320a to form a plurality of supporting structures 323, In such embodiments, the material for the supporting structures 323 is identical to that for the isolation layer 310.

Figure 10C:
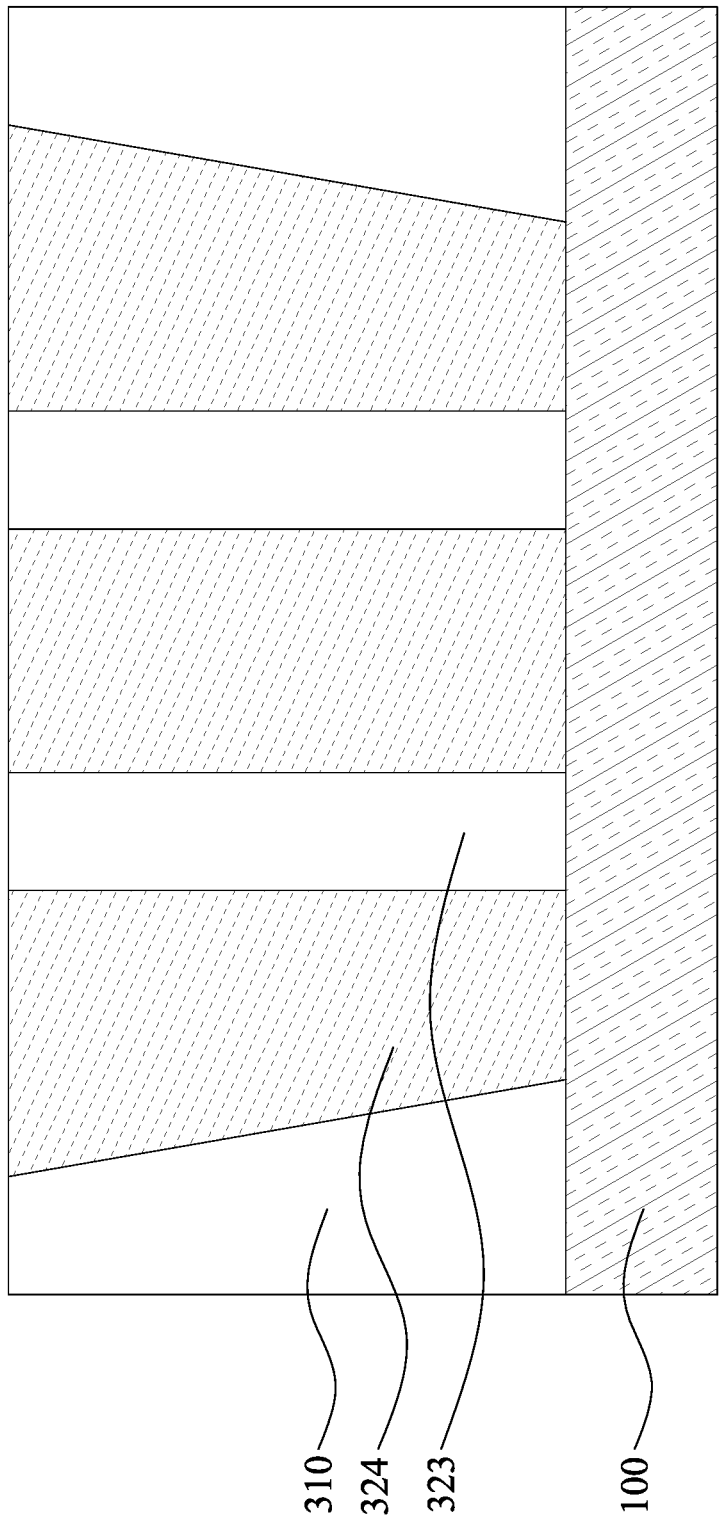

At operation 504, with reference to FIG. 10C, pad trench 320a is filled with electrically conductive material to form an electrically conductive structure 324 on the exposed portion of the semiconductor structure 100, so the electrically conductive structure 324 contacts the semiconductor structure 100. The electrically conductive material may include metal, metal alloy, and so on, such as copper (Cu), copper alloy, aluminum (Al), aluminum alloy, or combinations thereof. A planarization, such as a CMP operation, can be performed to remove superfluous material and to planarize the electrically conductive structure 324, as shown in FIG. 10C. Consequently, a bonding pad 320 having a planarized bonding surface can be obtained. It should be noted that the supporting structures 324, which have materials with lower polishing rate selectivity than the electrically conductive structure 324, help to mitigate dishing effect during the planarization.

At operation 505, the first and second semiconductor structures 100 and 200 are bonded together through the first and second bonding layers 300 and 400, so the bonding surfaces of the first and second bonding layers 300 and 400 contact with each other. In some embodiments, both semiconductor structures 100 and 200 are bonded together through the first and second bonding lavers 300 and 400 by hybrid bonding with application of heat and/or pressure. For example, during hybrid bonding, both bonding layers 300 and 400 along with the semiconductor structures 100 and 200 are heated to a temperature in a range from about 100° C. to about 200° C. such that isolation layers 310 and 410 become a non-confined viscous liquid and are reflowed. By Yellowing isolation layers 310 and 410, voids therein may be eliminated. Afterwards, both bonding layers 300 and 400 along with the semiconductor structures 100 and 200 are further heated to a higher temperature in a range from about 200° C. to about 400° C., such that first and second bonding pads 320 and 420 are interconnected by thermocompression bonding and isolation layers 310 and 410 are fully cured. In some embodiments, the pressure for hybrid bonding is in a range from about 0.5 bar to about 15 bar. The hybrid bonding process may be performed in an inert environment, such as an environment filled with inert gas including $N_2$, Ar, He, or combinations thereof.

Figure 11:
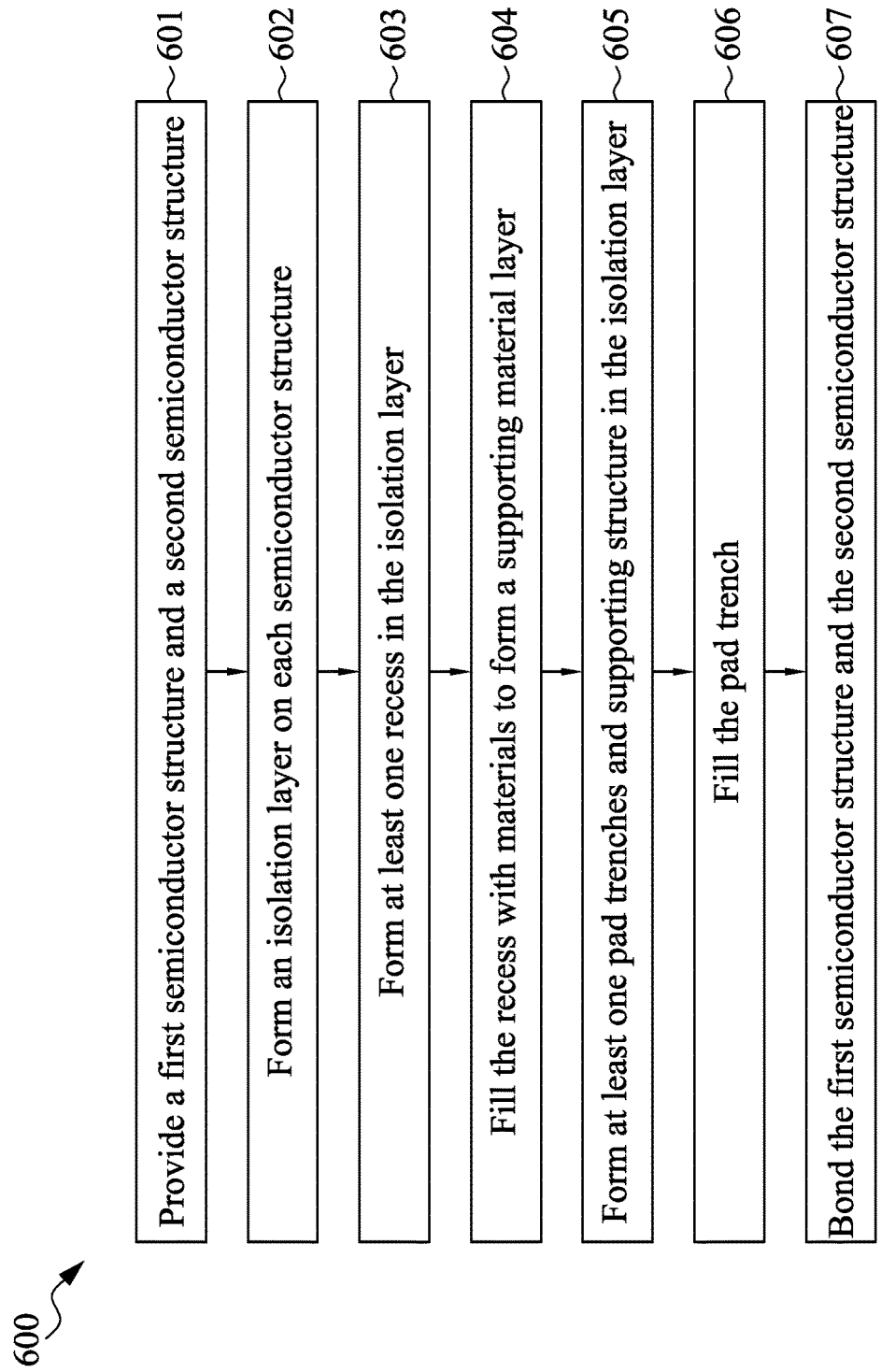
FIG. 11 is a flow chart illustrating a method of fabricating a package structure, in accordance with some another embodiments of the present disclosure.

FIG. 11 is a flowchart representing a method 600 of manufacturing a package structure according to various aspects of the present disclosure in accordance with some alternative embodiments. Method 600 of manufacturing the package structure includes a number of operations (601, 602, 603, 604, 605, 606 and 607). It should be noted that the operations of the method 600 may be rearranged or otherwise modified within the scope of the various aspects. It should further be noted that additional processes may be provided before, during, and after the method 600, and that some other processes may be only briefly described herein.

As shown in FIGS. 11 and 12A to 12F, method 600 begins at operation 601 by providing or receiving a first semiconductor structure 100 and a second semiconductor structure 200. Details of first and second semiconductor structures 100 and 200 are mentioned above and, therefore, the repeated descriptions of such details are omitted for brevity.

To form bonding layers 300 and 400 respectively on the first semiconductor structure 100 and the second semiconductor structure 200, the formation of bonding layers 300 and 400 comprises forming isolation layers 310 and 410 over the semiconductor structures 100 and 200 at operation 602; forming at least one recess in the isolation layer 310 and 410 at operation 603; fill the recess with materials to form a supporting material layer at operation 604, forming at least one pad trench and supporting structures in the supporting material layer at operation 605; and filling the pad trench at operation 606.

At operation 602, as shown in FIG. 12A, an isolation layer 310 is formed over the first semiconductor structure 100 and a mask 700a can be applied onto the isolation layer 310 for defining a location and a dimension of the bonding pads 320.

Figure 12B:
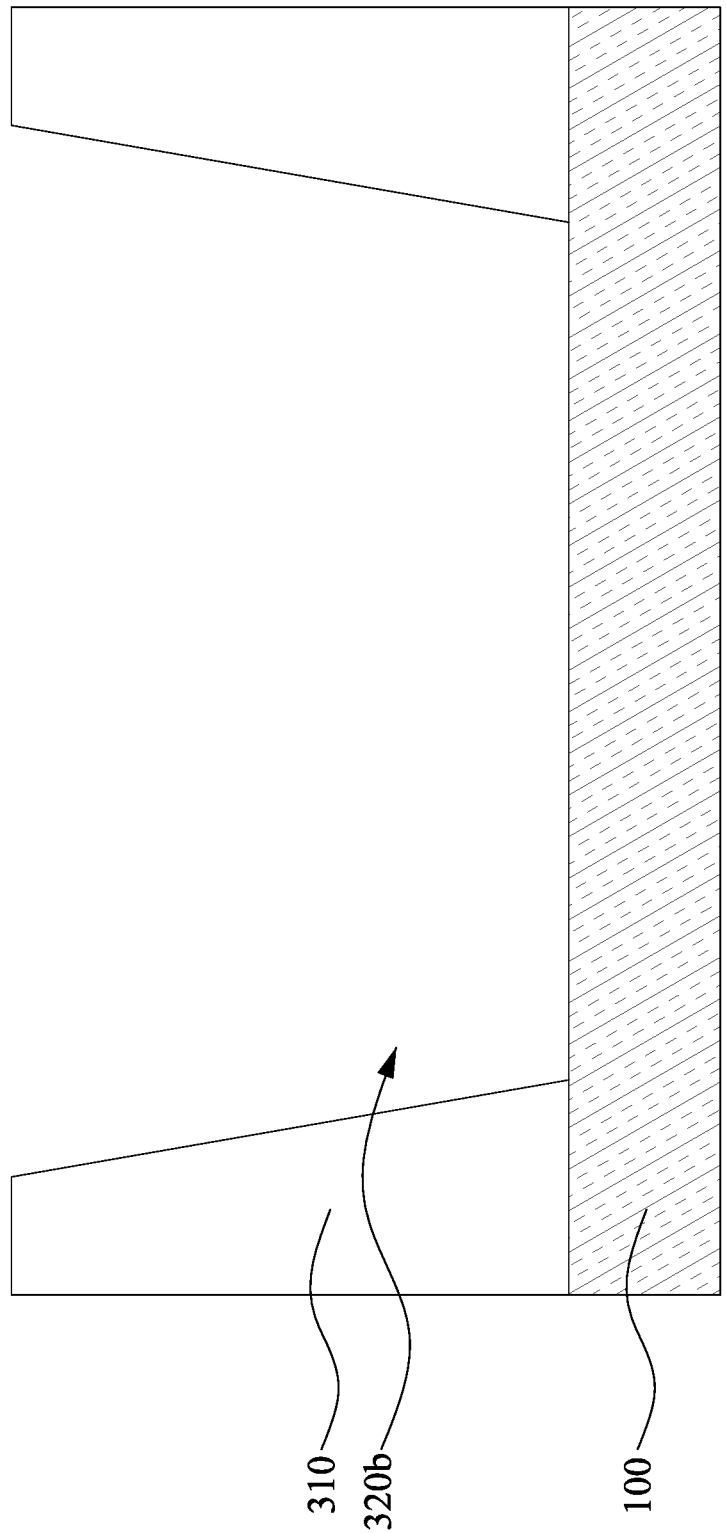

At operation 603, after etching the isolation layer 310, at least a recess 320b is formed in isolation layer 310. In some embodiments, the recess 320b can define a location and a dimension for the bonding pad 320. In some embodiments, the semiconductor structure 100 is exposed from the recesses 320b, as shown in FIG. 12B.

Figure 12C:
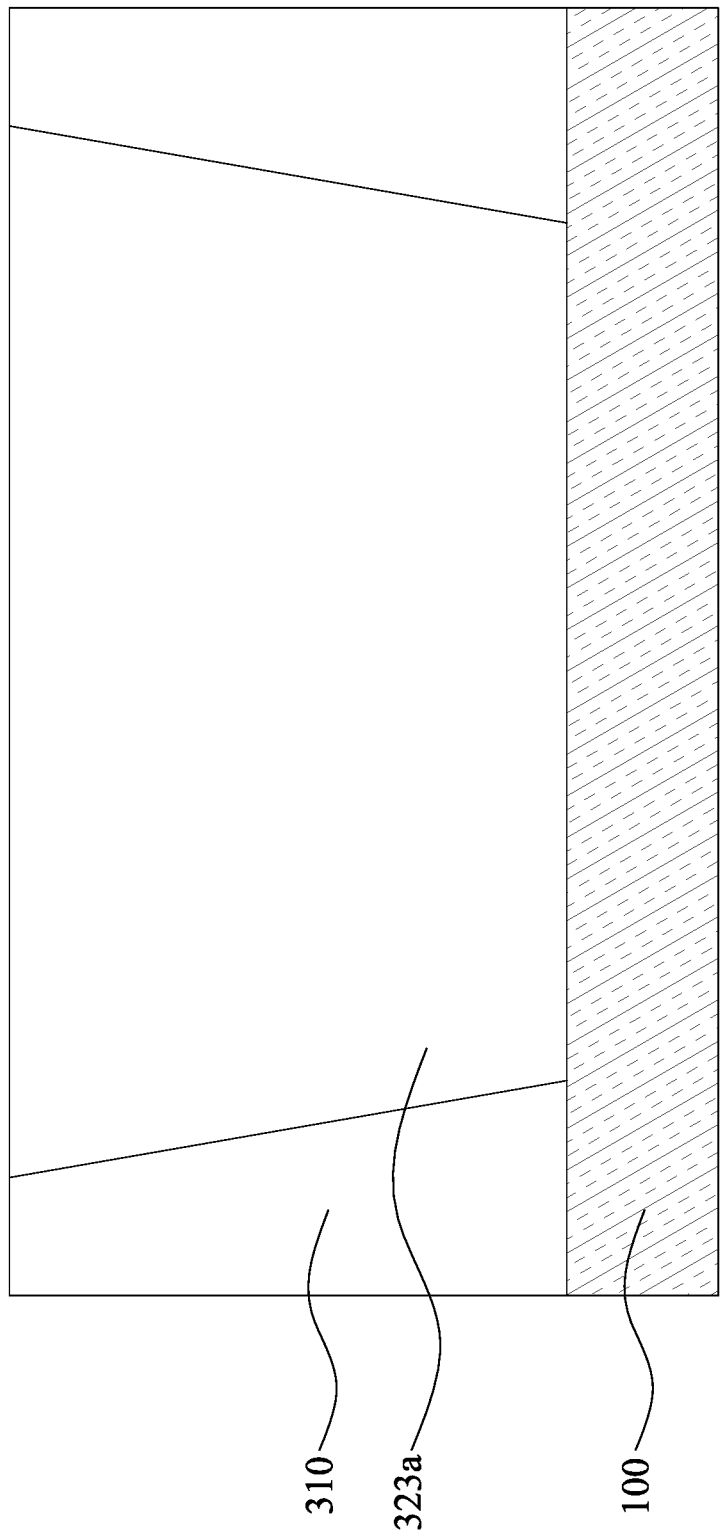

At operation 604, as shown in FIG. 12C, recess 320b can be filled with materials for forming supporting structures 323, so a supporting material layer 323a can be formed in the recess 320b and covers the exposed portions of the semiconductor structure 100. The supporting material layer 323a may comprise electrically conductive materials, dielectric materials and other materials. The conductive materials may include, but not limited to, titanium nitride (TiN), tantalum nitride (TaN), tungsten (W) and so on. The dielectric materials may include, but not limited to, silicon oxide (such as SiO, $SiO_2$), silicon nitride (such as SiN, $Si_3N_4$), silicon carbide (SiC) and so on.

Figure 12D:
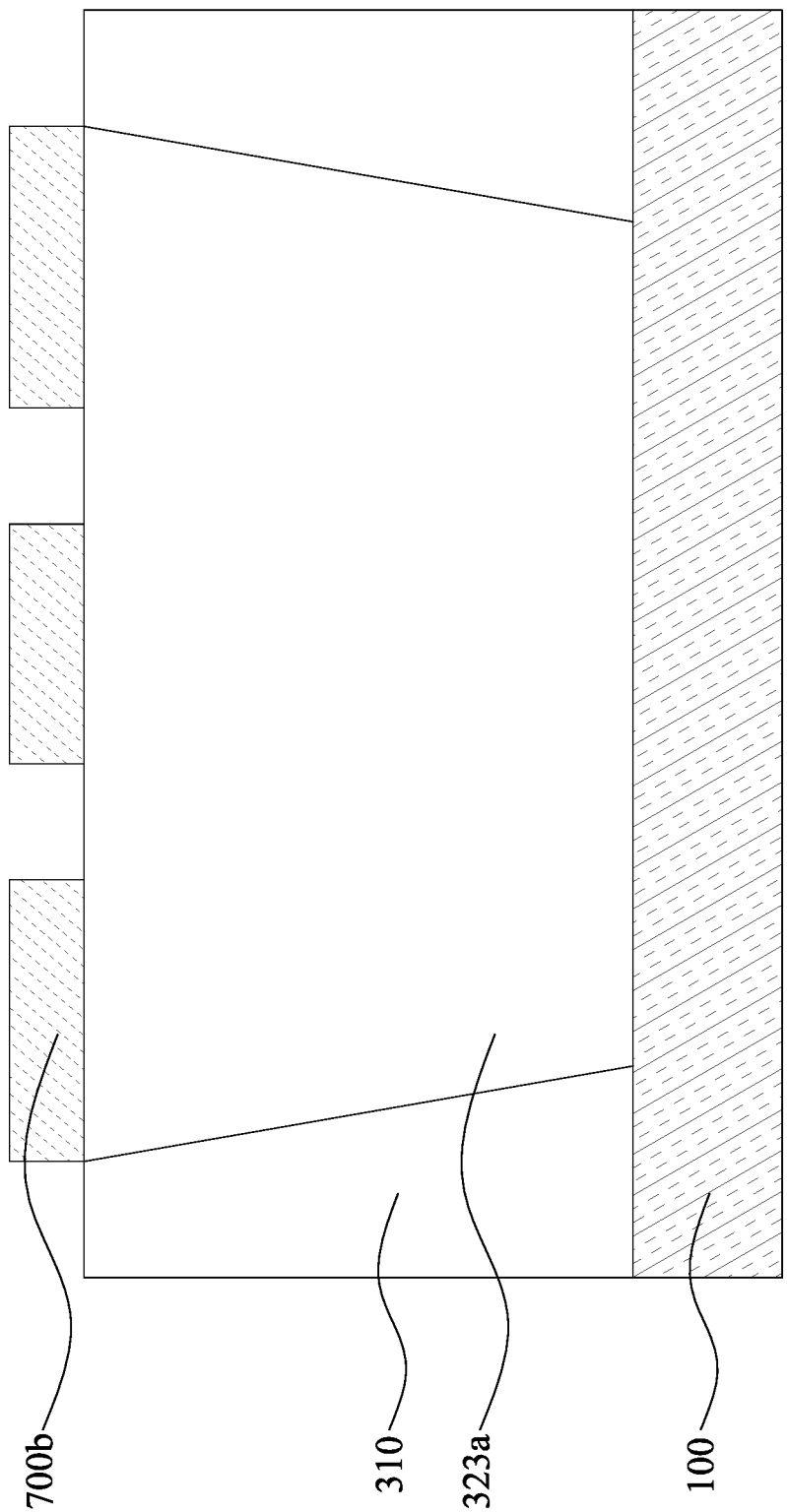
Figure 12E:
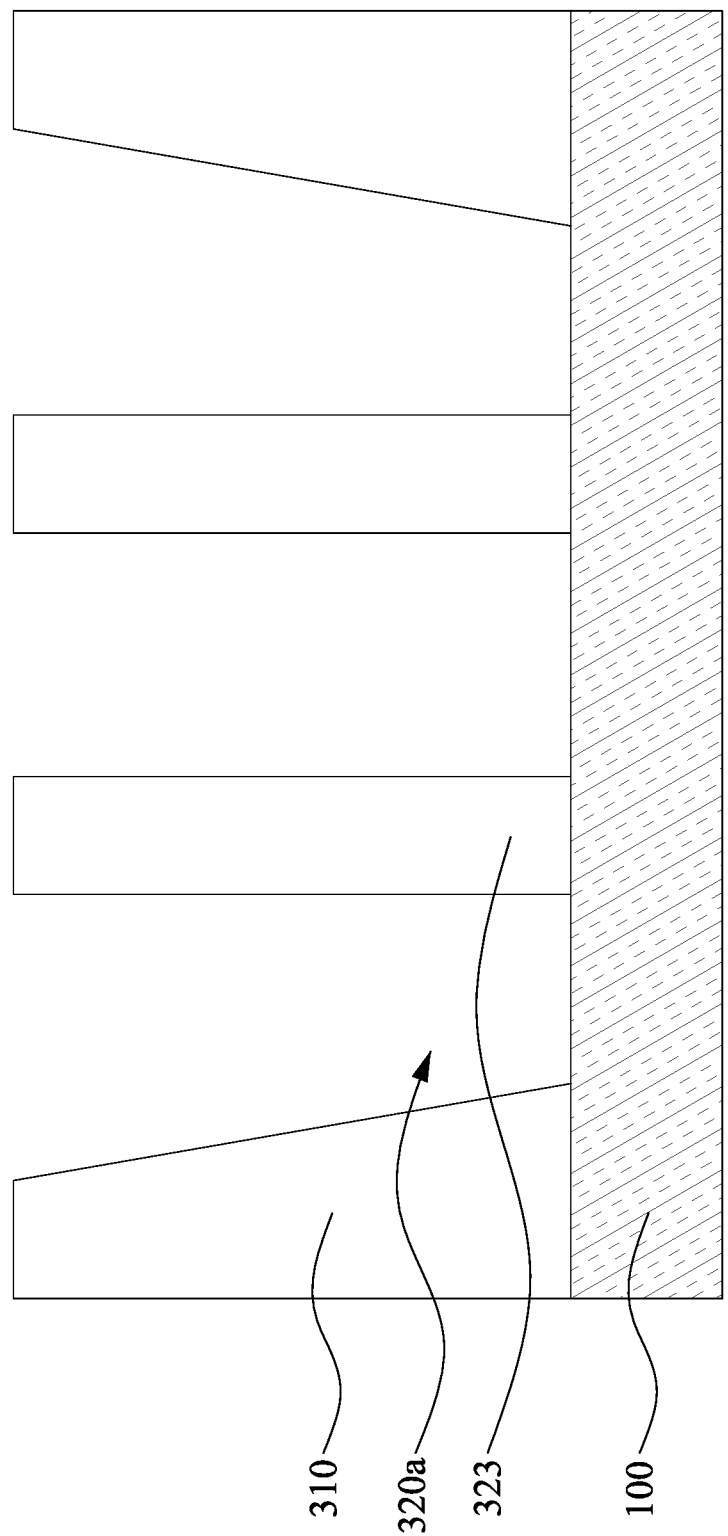

At operation 605, as illustrated in FIG. 12D, for defining the location and dimension of the supporting structures 323 (as shown in FIG. 12E), mask 700b can be applied onto the supporting material layer 323a. In FIG. 12E, etching is performed to form at least one pad trench 320a with a plurality of supporting structures 323. Some portions of semiconductor structure 100 can be exposed from the pad trench 320a.

Figure 12F:
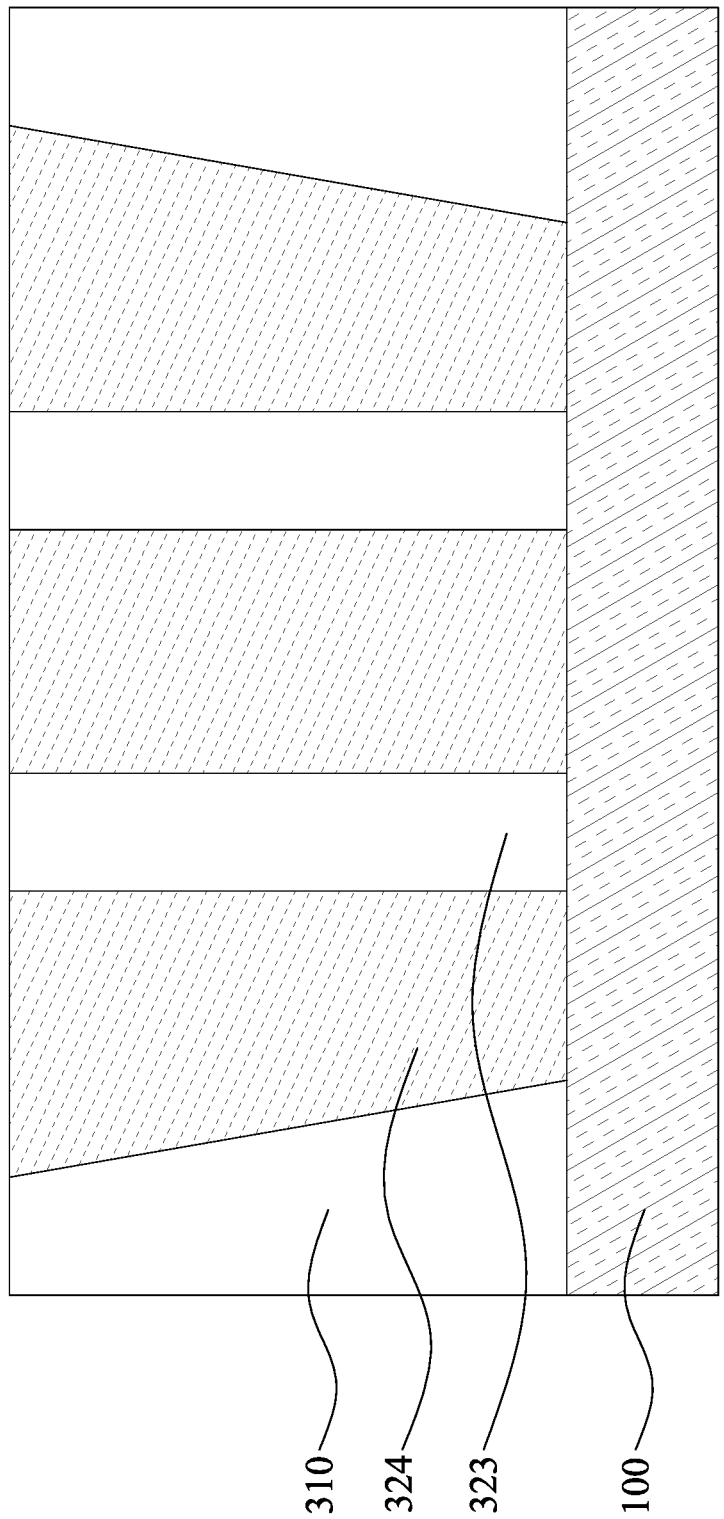

At operation 606, referring to FIG. 12F, pad trench 320a can be filled with electrically conductive material to form an electrically conductive structure 324 on the exposed a portion of semiconductor structure 100, so the electrically conductive structure 324 contacts the semiconductor structure 100. The electrically conductive material may include metal, metal alloy, and so on, such as copper (Cu), copper alloy, aluminon (Al), aluminum alloy, or combinations thereof. A planarization, such as a CMP operation, can be performed to remove superfluous material and to planarize the electrically conductive structure 324, as shown in FIG. 12F. Consequently, a bonding pad 320 having a planarized bonding surface can be obtained. As mentioned above, the supporting structures 324, which have materials with lower polishing rate selectivity than the electrically conductive structure 324, helps to mitigate dishing effect during the planarization.

At operation 607, the first and second semiconductor structures 100 and 200 are bonded together through the first and second bonding layers 300 and 400, so the bonding surfaces of the first and second bonding layers 300 and 400 contact with each other as described above; therefore, repeated descriptions of such details are omitted for brevity.

Figure 13A:
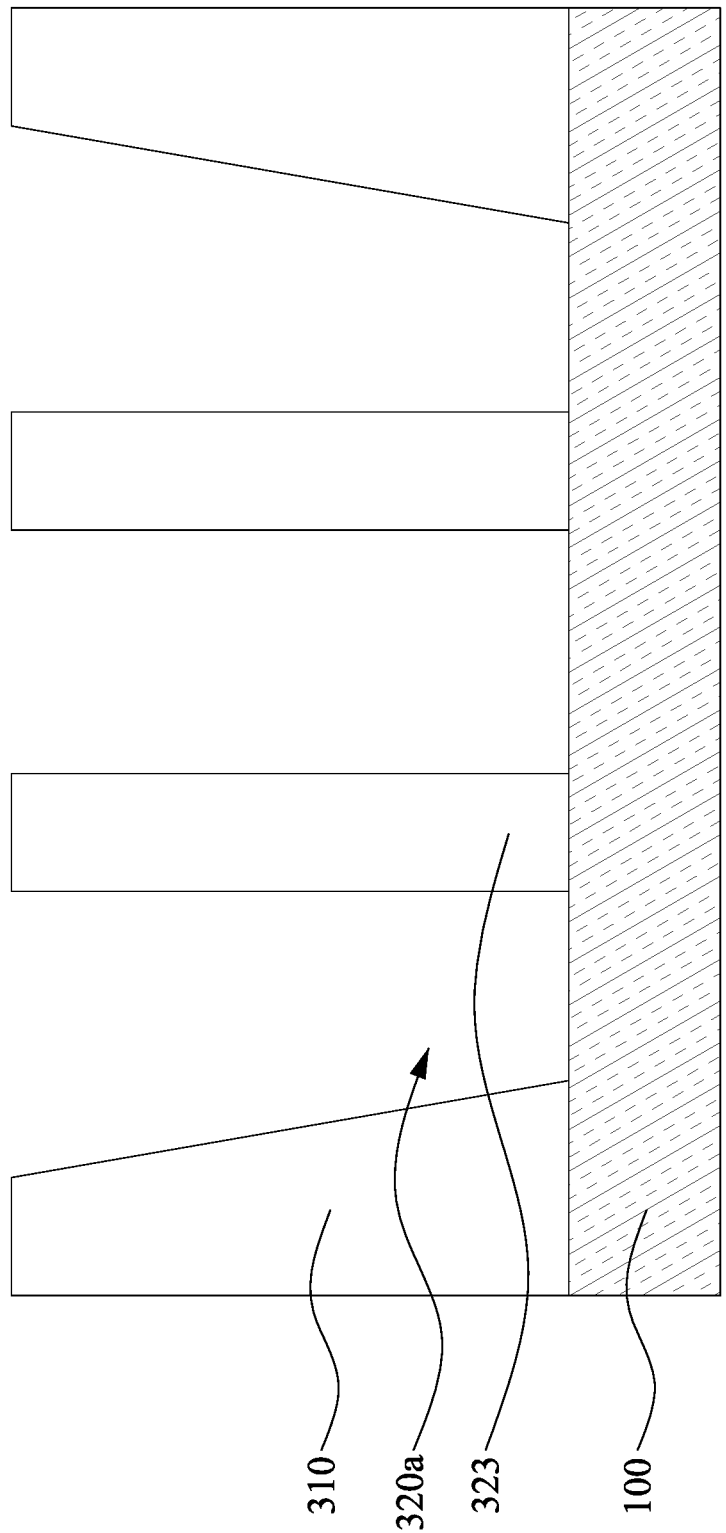
FIGS. 13A to 13C illustrate diagrammatic cross-sectional side views of some embodiments of a package structure at various stages of fabrication, according to the method of the present invention.
Figure 13B:
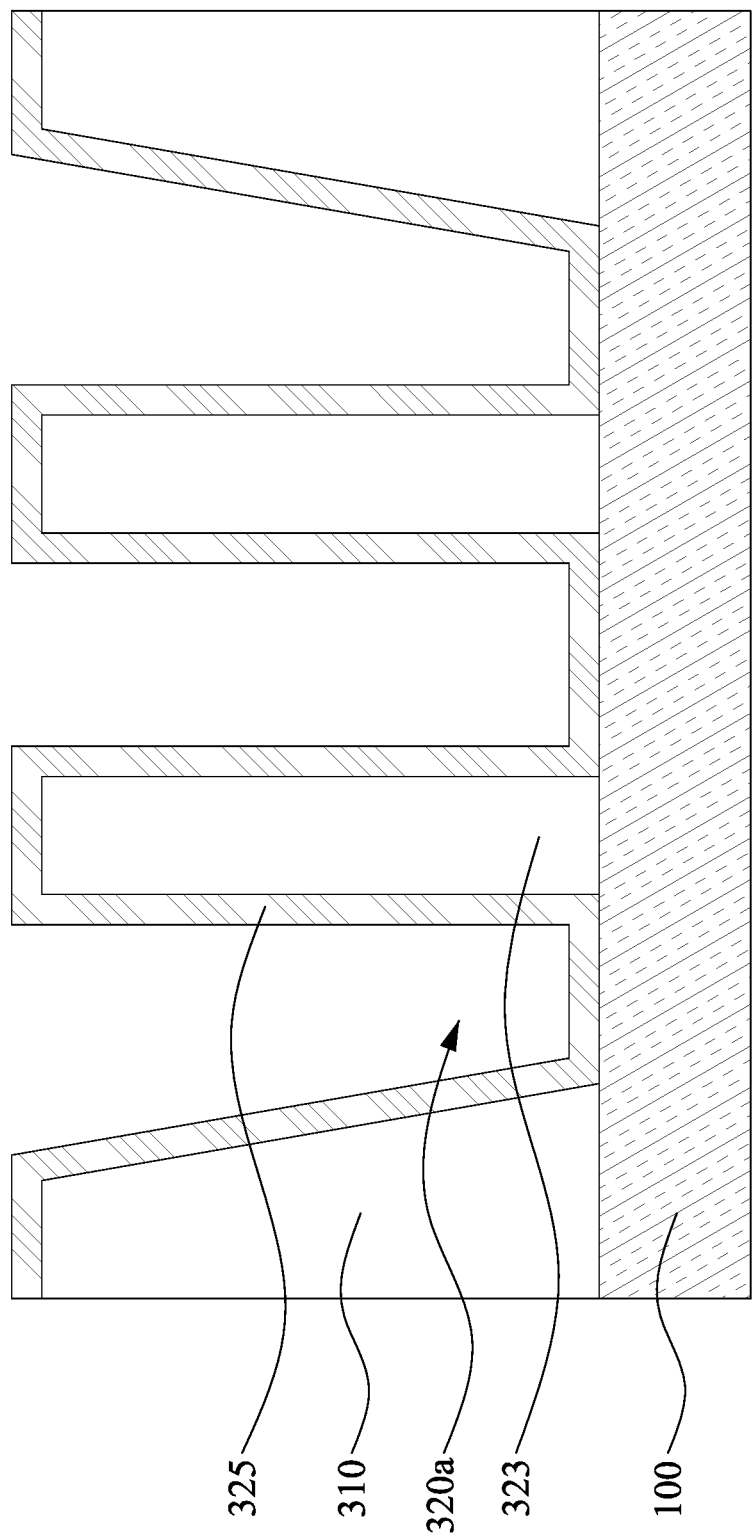
Figure 13C:
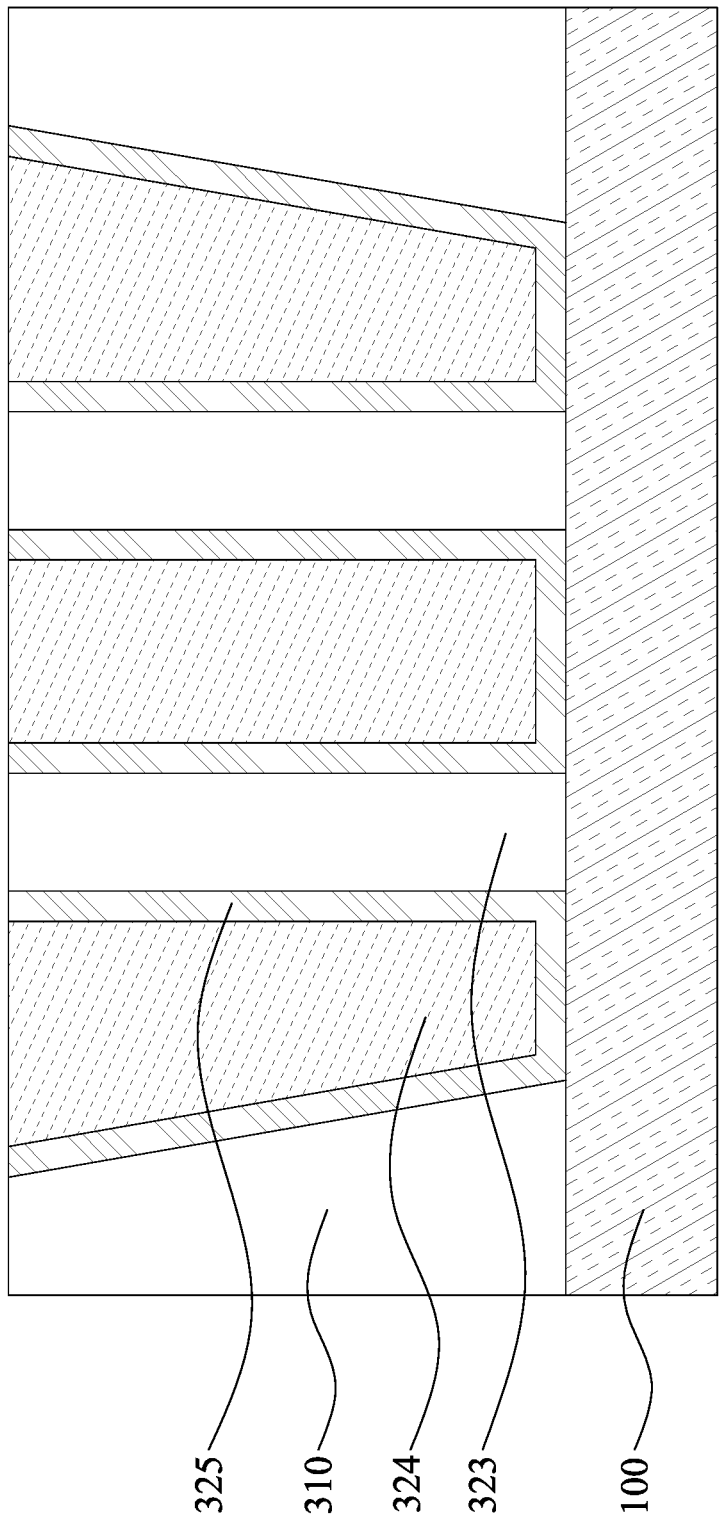

FIGS. 13A to 13C show some yet another embodiments for forming bonding pads 320 and 420, After pad trench 320a is formed with a plurality of supporting structures 323 and a portion of semiconductor structure 100 is exposed from the pad trench 320a (FIG. 13A), an electrically conductive interlayer 325 may be applied to cover sidewall of the pad trench 320a and the exposed the exposed portion of the semiconductor structure 100 and to surround the supporting structures 323 (FIG. 13B). Pad trench 320a is filled with electrically conductive material to form an electrically conductive structure 324 and thus the electrically conductive interlayer 325 serve as a bottom and sidewall of the electrically conductive structure 324. With reference to FIG. 13C, after planarization, the top of supporting structure 323 can be exposed. Therefore, in some embodiments, the bonding surface may expose three different materials, including materials for the supporting structures 323, materials for the electrically conductive structure 324 and materials for the electrically conductive interlayer 325.

It is noted that although the reference numerals used in FIGS. 10A to 10C, 12A to 12F and 13A to 13C are those in the first bonding layer, the second bonding layer may have the same arrangement; therefore, repeated descriptions for the second bonding layer are omitted for brevity.

As mentioned above, each bonding pad 320 and 420 has a bonding surface including a bonding region 321 and 421 and at least one buffer region 322 and 422. When the first bonding pad 320 is bonded to the second bonding pad 420, the bonding region 321 of the first bonding pad 320 is bonded to the bonding region 421 of the second bonding pad 420 while the first buffer region 322 of first bonding pad 320 is bonded to the isolation layer 410 of the second bonding pad 420 and the second buffer region 422 of second bonding pad 420 is bonded to the isolation layer 310 of the first bonding pad 320. In some embodiments, for one bonding surface, the ratio of the surface area of the buffer region 322 and 422 to that of the bonding region 321 and 421 may be from about 0.01 to about 10. In some embodiments, the ratio of the surface area of the buffer region 322 and 422 to that of the bonding region 321 and 421 may be from about 0.1 to about 5. In some embodiments, the ratio of the surface area of the buffer region 322 and 422 to that of the bonding region 321 and 421 may be from about 0.5 to about 4. In some embodiments, the bonding surface of the first bonding pad 320 has a central axis A and the bonding surface of the second bonding pad 420 has a central axis B. In some embodiments, the angle θ between the central axis A and the central axis B is larger than 0° and less than 180°. In some embodiments, the angle θ may range from about 10° to about 170°. In some embodiments, the angle θ may range from about 45° to about 135°. In some embodiments, the angle θ may be about 90°.

In the present disclosure, a method of manufacturing a package structure comprises receiving a first semiconductor structure and a second semiconductor structure; forming an isolation layer on each semiconductor structure; forming at least one supporting structure and at least one pad trench in the isolation layer; filling the pad trench with electrically conductive material; planarizing the isolation layer and the electrically conductive material to form bonding pads in a bonding layer on each semiconductor structure; and bonding the semiconductor structures.

In some embodiments, a method of manufacturing a package structure comprises receiving a first semiconductor structure and a second semiconductor structure; forming an isolation layer with a recess on each semiconductor structure, so that the semiconductor structure exposed from the recess; forming a supporting material layer in the at least one recess to cover the exposed portion of the semiconductor structure; removing a portion of the supporting material layer to form at least one supporting structure and at least one pad trench in the isolation layer; filling the pad trench with electrically conductive material; planarizing the isolation layer and the electrically conductive material to form bonding pads in a bonding layer on each semiconductor structure; and bonding the semiconductor structures.

In some embodiments, a method of manufacturing a package structure comprises receiving a first semiconductor structure and a second semiconductor structure; forming an isolation layer with a recess on each semiconductor structure, so that the semiconductor structure exposed from the recess; forming a supporting material layer in the at least one recess to cover the exposed portion of the semiconductor structure; removing a portion of the supporting material layer to form at least one supporting structure and at least one pad trench in the isolation layer; forming an electrically conductive interlayer along a bottom and a sidewall of the pad trench and a top of the supporting structure; filling the pad trench with electrically conductive material; planarizing the isolation layer and the electrically conductive material to form bonding pads in a bonding layer on each semiconductor structure; and bonding the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures fir carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a package structure, comprising
receiving a first semiconductor structure and a second semiconductor structure;
forming an isolation layer on each semiconductor structure;
forming at least one supporting structure and at least one pad trench in the isolation layer;
filling the pad trench with electrically conductive material;
planarizing the isolation layer and the electrically conductive material to form bonding pads in a bonding layer on each semiconductor structure; and
bonding the semiconductor structures,
wherein each bonding pad has a bonding surface including a bonding region and at least one buffer region; and a ratio of a surface area of the buffer region to that of the bonding region is from about 0.01 to about 10.

2. The method of claim 1, wherein materials of the supporting structures are identical to those of the isolation layer.

3. The method of claim 1, wherein materials of the supporting structures have lower polishing rate selectivity than those of the electrically conductive structure.

4. The method of claim 1, further comprising forming an electrically conductive interlayer along a bottom and sidewalls of the pad trench and supporting structures after forming of the at least one supporting structure and at least one pad trench.

5. The method of claim 1, wherein bonding the semiconductor structures comprises contacting the bonding surface of the bonding layer on the first semiconductor structure with the bonding surface of the bonding layer on the second semiconductor structure; wherein the bonding pad of the first semiconductor structure has a first central axis and the bonding pad of the second semiconductor structure has a second central axis; and wherein an angle between the first central axis and the second central axis is larger than 0° and less than 180°.

6. The method of claim 1, wherein bonding the semiconductor structures comprises bonding the bonding layer of the first semiconductor structure and the bonding layer of the second semiconductor structure by hybrid bonding with application of heat and/or pressure.

7. The method of claim 1, wherein the supporting structure is made of dielectric materials, and the supporting structure is from about 0.1% in volume to about 80% in volume based on the total volume of the bonding pad.

8. A method of manufacturing a package structure, comprising
receiving a first semiconductor structure and a second semiconductor structure;
forming an isolation layer with a recess on each semiconductor structure, so that the semiconductor structure exposed from the recess;
forming a supporting material layer in the at least one recess to cover the exposed portion of the semiconductor structure;
removing a portion of the supporting material layer to form at least one supporting structure and at least one pad trench in the isolation layer;
filling the pad trench with an electrically conductive material;
planarizing the isolation layer and the electrically conductive material to form bonding pads in a bonding layer on each semiconductor structure; and
bonding the semiconductor structures,
wherein each bonding pad has a bonding surface including a bonding region and at least one buffer region; and a ratio of a surface area of the buffer region to that of the bonding region is from about 0.01 to about 10.

9. The method of claim 8, wherein materials of the supporting structure are identical to those of the isolation layer.

10. The method of claim 8, wherein materials of the supporting structures have lower polishing rate selectivity than those of the electrically conductive structure.

11. The method of claim 8, wherein bonding the semiconductor structures comprises contacting the bonding surface of the bonding layer on the first semiconductor structure with the bonding surface of the bonding layer on the second semiconductor structure; wherein the bonding pad of the first semiconductor structure has a first central axis and the bonding pad of the second semiconductor structure has a second central axis; and wherein an angle between the first central axis and the second central axis is larger than 0° and less than 180°.

12. The method of claim 8, wherein bonding the semiconductor structures comprises bonding the bonding layer of the first semiconductor structure and the bonding layer of the second semiconductor structure by hybrid bonding with application of heat and/or pressure.

13. The method of claim 8, wherein the supporting structure is made of dielectric materials, and the supporting structure is from about 0.1% in volume to about 80% in volume based on the total volume of the bonding pad.

14. A method of manufacturing a package structure, comprising
receiving a first semiconductor structure and a second semiconductor structure;
forming an isolation layer with a recess on each semiconductor structure, so that the semiconductor structure exposed from the recess;
forming a supporting material layer in the at least one recess to cover the exposed portion of the semiconductor structure;
removing a portion of the supporting material layer to form at least one supporting structure and at least one pad trench in the isolation layer;
forming an electrically conductive interlayer along a bottom and a sidewall of the pad trench and a top of the supporting structure;
filling the pad trench with electrically conductive material;
planarizing the isolation layer and the electrically conductive material to form bonding pads in a bonding layer on each semiconductor structure; and
bonding the semiconductor structures, wherein each bonding pad has a bonding surface including a bonding region and at least one buffer region; and a ratio of a surface area of the buffer region to that of the bonding region is from about 0.01 to about 10.

15. The method of claim 14, wherein materials of the supporting structure are identical to those of the isolation layer.

16. The method of claim 14, wherein materials for the supporting structure, materials for the electrically conductive structure and materials for the electrically conductive interlayer are different.

17. The method of claim 14, wherein materials of the supporting structures have lower polishing rate selectivity than those of the electrically conductive structure.

18. The method of claim 14, wherein bonding the semiconductor structures comprises contacting the bonding surface of the bonding layer on the first semiconductor structure with the bonding surface of the bonding layer on the second semiconductor structure; wherein the bonding pad of the first semiconductor structure has a first central axis and the bonding pad of the second semiconductor structure has a second central axis; and wherein an angle between the first central axis and the second central axis is larger than 0° and less than 180°.

19. The method of claim 18, wherein the angle between the first central axis and the second central axis is about 90°.

20. The method of claim 14, wherein the supporting structure is made of dielectric materials, and the supporting structure is from about 0.1% in volume to about 80% in volume based on the total volume of the bonding pad.

* * * * *